United States Patent
Kawasaki et al.

(10) Patent No.: US 10,121,666 B2
(45) Date of Patent: Nov. 6, 2018

(54) ION IMPLANTATION METHOD AND ION IMPLANTATION APPARATUS

(71) Applicant: Sumitomo Heavy Industries Ion Technology Co., Ltd., Tokyo (JP)

(72) Inventors: Yoji Kawasaki, Ehime (JP); Makoto Sano, Ehime (JP); Kazutaka Tsukahara, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 6 days.

(21) Appl. No.: 15/374,181

(22) Filed: Dec. 9, 2016

(65) Prior Publication Data

US 2017/0170020 A1 Jun. 15, 2017

(30) Foreign Application Priority Data

Dec. 10, 2015 (JP) ................................. 2015-240793

(51) Int. Cl.
*H01L 21/265* (2006.01)
*H01L 21/66* (2006.01)
*H01J 37/317* (2006.01)

(52) U.S. Cl.
CPC .... *H01L 21/26586* (2013.01); *H01J 37/3171* (2013.01); *H01L 22/14* (2013.01); *H01L 22/20* (2013.01)

(58) Field of Classification Search
CPC .............. H01J 37/304; H01J 37/3171; H01J 2237/1501; H01J 2237/24507; H01J 2237/31703; H01J 37/1471; H01J 37/244; H01L 21/266; H01L 21/26586; H01L 21/822; H01L 27/1461; H01L 27/14612; H01L 27/1463; H01L 2924/00; H01L 2924/0002; H01L 2924/181;

(Continued)

(56) References Cited

U.S. PATENT DOCUMENTS 5,838,058 A * 11/1998 Kitajima ........... H01L 21/26586
257/628
6,555,832 B1 * 4/2003 Ryding ............... H01J 37/1471
250/252.1

(Continued)

FOREIGN PATENT DOCUMENTS

JP H03-008323 A 1/1991
JP H03-062442 A 3/1991

(Continued)

*Primary Examiner* — Edward Chin
(74) *Attorney, Agent, or Firm* — Michael Best & Friedrich LLP

(57) ABSTRACT

An ion implantation method for scanning an ion beam reciprocally in an x direction and moving a wafer reciprocally in a y direction to implant ions into the wafer is provided. The method includes: irradiating a first wafer arranged to meet a predetermined plane channeling condition with the ion beam and measuring resistance of the first wafer irradiated with the ion beam; irradiating a second wafer arranged to meet a predetermined axial channeling condition with the ion beam and measuring resistance of the second wafer irradiated with the ion beam; and adjusting an implant angle distribution of the ion beam by using results of measuring the resistance of the first and second wafers.

16 Claims, 19 Drawing Sheets

(58) Field of Classification Search
CPC ........... H01L 23/3107; H01L 23/49548; H01L 21/4842; H01L 21/561; H01L 21/568; H01L 23/3114; H01L 23/49537; H01L 23/49541; H01L 23/49558; H01L 23/49582
USPC .. 257/E21.346, E21.345, E21.606, E29.004, 257/E29.062, E29.063, 607, 628; 438/514
See application file for complete search history.

(56) References Cited

U.S. PATENT DOCUMENTS

| | | | |
|---|---|---|---|
| 7,282,721 B2* | 10/2007 | Sullivan | H01J 37/244 250/396 R |
| 2011/0086500 A1* | 4/2011 | Yoneda | G21K 5/04 438/514 |

FOREIGN PATENT DOCUMENTS

| | | |
|---|---|---|
| JP | H07-172990 A | 7/1995 |
| JP | 2003-511845 A | 3/2003 |
| JP | 2005-502174 A | 1/2005 |
| JP | 2005-353537 A | 12/2005 |
| JP | 2006-245506 A | 9/2006 |
| JP | 2011-086643 A | 4/2011 |

* cited by examiner

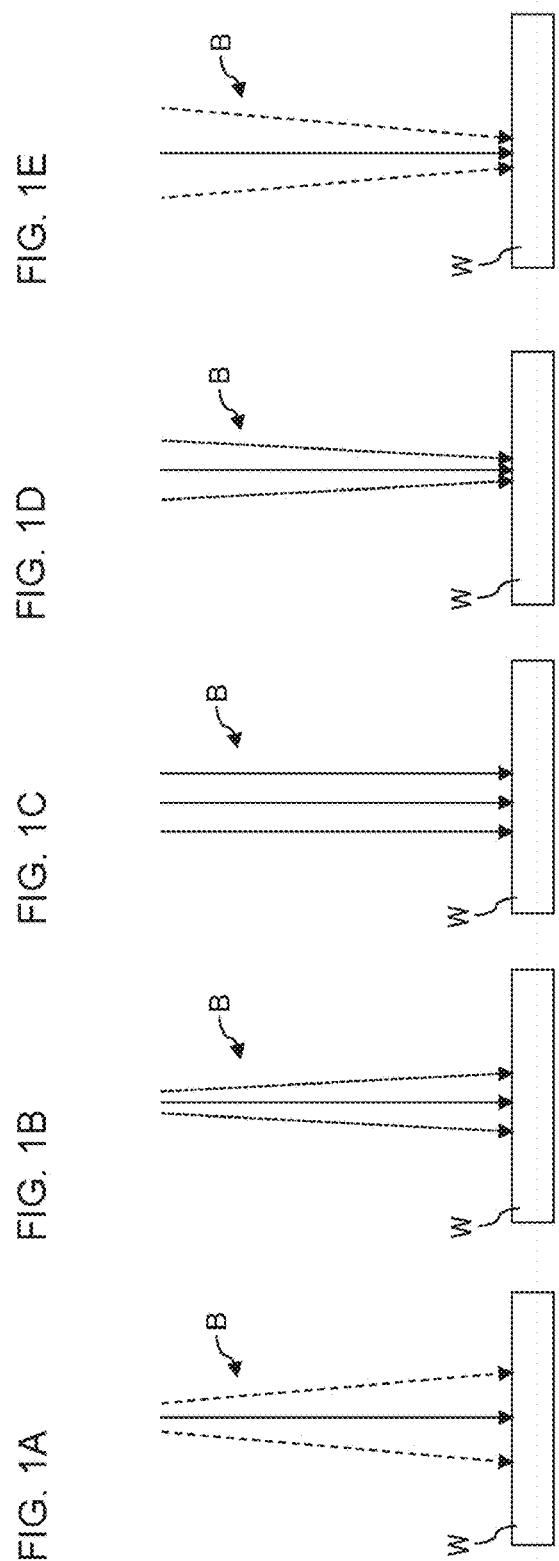

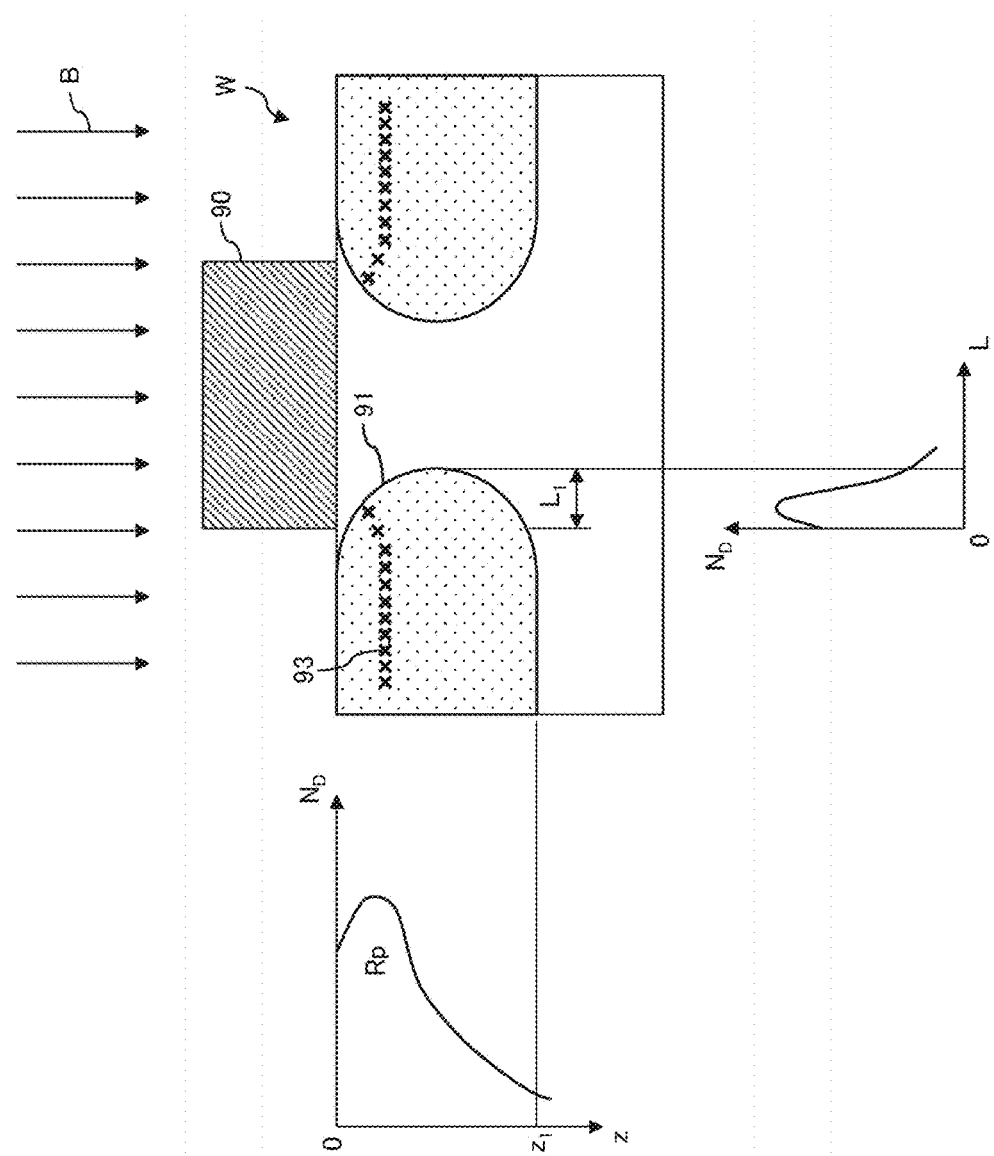

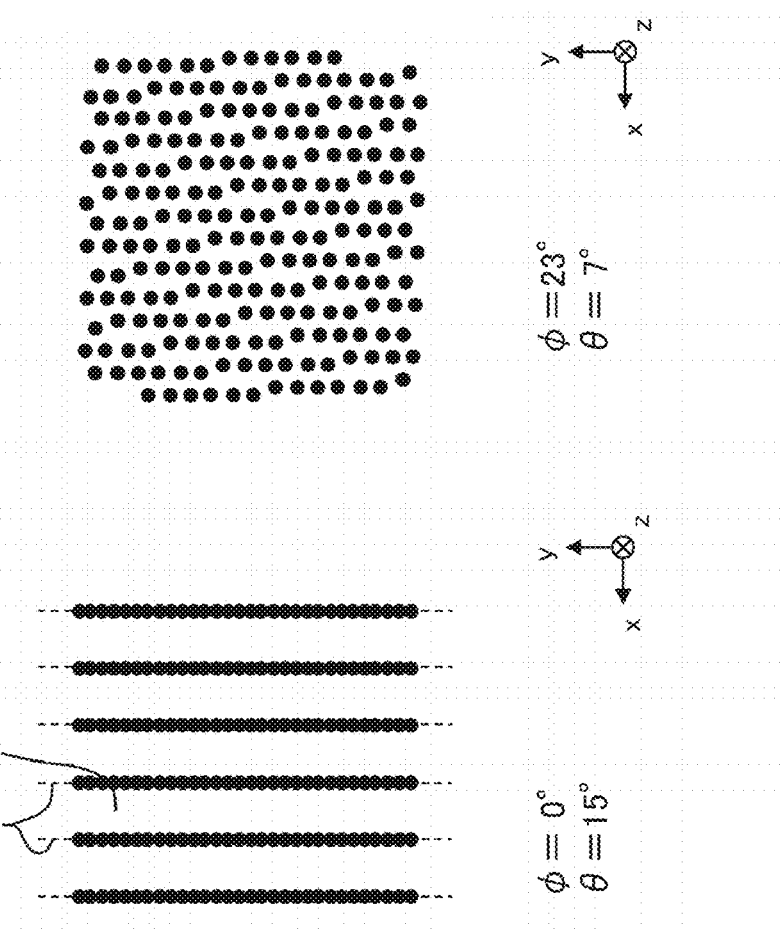

ION IMPLANTATION METHOD AND ION IMPLANTATION APPARATUS

RELATED APPLICATION

Priority is claimed to Japanese Patent Application No. 2015-240793, filed on Dec. 10, 2015, the entire content of which is incorporated herein by reference.

BACKGROUND OF THE INVENTION

1. Field of the Invention

The present invention relates to an ion implantation method and ion implantation apparatus and, more particularly, to a technology of controlling the implant angle distribution of an ion beam.

2. Description of the Related Art

In a semiconductor manufacturing process, the process of implanting a semiconductor wafer with ions (hereinafter, also referred to as "ion implantation process") is generally performed for the purpose of changing the conductivity of the semiconductor, changing the crystal structure of the semiconductor, etc. Apparatuses used in the ion implantation step are called ion implantation apparatuses. Ion implantation apparatuses are provided with the function of generating ions by using an ion source and forming an ion beam by accelerating the generated ions, and the function of transporting the ion beam to the implantation processing chamber and irradiating a wafer in the chamber with the ion beam. For the purpose of implanting the entire surface of the wafer subject to processing, the ion beam is reciprocally scanned by a beam scanner and the wafer is reciprocally moved in a direction perpendicular to the direction of beam scan.

It is known that when the angle of the ion beam incident into the wafer is changed, the mode of interaction between the ion beam and the wafer is changed, affecting the processing result of ion implantation. For example, an ion beam incident along a crystal axis or crystal plane of the wafer results in a channeling phenomenon in which implanted ions reach deeper into the wafer from the beam incident surface than otherwise, affecting the carrier concentration distribution inside the wafer obtained as a result of the implantation process. In this background, methods for controlling the incident angle of an ion beam used in the implantation process are proposed.

Angle characteristics of an ion beam incident on a wafer include angle distribution of ion particles forming the ion beam as well as average incident angle of the ion beam as a whole. An ion beam incident on a wafer may diverge or converge slightly. Thus, the ion particles forming the beam have an angle distribution with a certain spread. If the angle component of some of the ion particles with deviation in the incident angle meets a channeling condition, a channeling phenomenon due to those ions occurs, even if the average incident angle of the beam as a whole does not meet the channeling condition. Conversely, if the angle component of some the ion particles with deviation in the incident angle does not meet the channeling condition, a channeling phenomenon due to those ions is inhibited, even if the average incident angle of the beam as a whole meets the channeling condition. It is therefore necessary to control the beam angle distribution precisely in order to control the shape and range of carrier concentration distribution formed in the wafer precisely.

SUMMARY OF THE INVENTION

The present invention addresses the issue described above and a need to provide a technology of improving precision of an ion implantation process.

An ion implantation method according to an embodiment is a method for scanning an ion beam reciprocally in an x direction and moving a wafer reciprocally in a y direction to implant ions into the wafer. The method includes: irradiating a first wafer arranged to meet a predetermined plane channeling condition with the ion beam and measuring resistance of the first wafer irradiated with the ion beam; irradiating a second wafer arranged to meet a predetermined axial channeling condition with the ion beam and measuring resistance of the second wafer irradiated with the ion beam; and adjusting an implant angle distribution of the ion beam relative to the wafers in the x direction and in the y direction by using results of measuring the resistance of the first and second wafers.

Another embodiment relates to an ion implantation apparatus. The apparatus includes: two or more lens devices that converge or diverge an ion beam by applying at least one of an electric field and a magnetic field; a beam scanner that scans the ion beam reciprocally in an x direction; a platen driver that reciprocally moves, in a y direction, a wafer irradiated with the ion beam reciprocally scanned; a resistance measurement instrument that measures resistance of the wafer irradiated with the ion beam; and a controller that determines operating parameters of the two or more lens devices based on a result of measurement of the resistance meter and performs an ion implantation process. The controller: causes a first wafer arranged by the platen driver to meet a predetermined plane channeling condition to be irradiated with the ion beam and causes the resistance measurement instrument to measure the resistance of the first wafer irradiated with the ion beam; causes a second wafer arranged by the platen driver to meet a predetermined axial channeling condition to be irradiated with the ion beam and causes the resistance measurement instrument to measure the resistance of the second wafer irradiated with the ion beam; and determines operating parameters of the two or more lens devices by using results of measuring the resistance of the first and second wafers and adjusts an implant angle distribution of the ion beam relative to the wafer in the x direction and the y direction.

Still another embodiment relates to an ion implantation method. The method is a method for scanning an ion beam reciprocally in an x direction and moving a wafer reciprocally in a y direction to implant the wafer with ions, wherein a target wafer is irradiated with the ion beam with an implant angle distribution adjusted in the x direction and the y direction so as to form a desired carrier concentration distribution in a principal surface of the target wafer.

Optional combinations of the aforementioned constituting elements, and implementations of the invention in the form of methods, apparatuses, and systems may also be practiced as additional modes of the present invention.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIGS. 1A-1E are diagrams schematically showing the angle characteristics of an ion beam incident on a wafer;

FIG. 3 schematically shows an impurity region formed in the vicinity of a gate structure by irradiation with the ion beam;

FIGS. 8A-8C schematically show atomic arrangements in the vicinity of the surface of the wafer arranged to meet a predetermined channeling condition or off-channeling condition;

DETAILED DESCRIPTION OF THE INVENTION

Figure 2A:
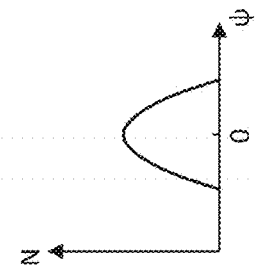
FIGS. 2A-2E are graphs schematically showing the angle distribution of the ion beam shown in FIG. 1A-1E.
Figure 2B:
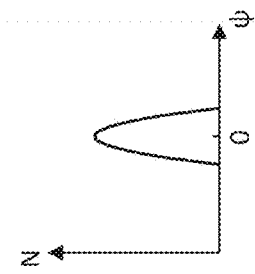

The invention will now be described by reference to the preferred embodiments. This does not intend to limit the scope of the present invention, but to exemplify the invention.

A detailed description will now be given of the embodiments of the present invention with reference to the attached drawings. Like numerals represent like elements so that the description will be omitted accordingly. The structure described below is by way of example only and does not limit the scope of the invention.

A brief summary will be given before describing the invention in specific details. The ion implantation apparatus according to an embodiment includes a beam scanner for reciprocally scanning an ion beam in the x direction, a platen driver for reciprocally moving a wafer irradiated with the reciprocally scanned ion beam in the y direction, and two or more lens devices for converging or diverging the ion beam by applying at least one of an electric field or a magnetic field on the ion beam. The two or more lens devices are configured to adjust the angle distribution of the ion beam incident on the wafer independently in the x direction and in the y direction by adjusting the force applied to the ion beam.

It is known that when the angle of the ion beam incident on the wafer is changed, the mode of interaction between the ion beam and the wafer is changed, affecting the processing result of ion implantation. For example, an ion beam incident along a crystal axis or crystal plane of the wafer results in a channeling phenomenon in which implanted ions reach deeper into the wafer from the beam incident surface than otherwise, affecting the carrier concentration distribution inside the wafer obtained as a result of the implantation process. For this reason, it is common in an ion implantation process to adjust the angle of tilt (tilt angle) of the wafer relative to the traveling direction of the ion beam (z direction) and the angle of rotation (twist angle) of the wafer around an axis perpendicular to the wafer surface so as to control the average implant angle of the beam as whole incident on the wafer.

Angle characteristics of an ion beam incident on a wafer include angle distribution of ion particles forming the ion beam as well as average incident angle of the ion beam as a whole. An ion beam incident on a wafer may diverge or converge slightly. Thus, the ion particles forming the beam have an angle distribution with a certain spread. If the angle component of some of the ion particles with deviation in the incident angle from the reference trajectory of the beam meets a channeling condition, a channeling phenomenon due to those ions occurs, even if the average incident angle of the beam as a whole does not meet the channeling condition. Conversely, if the angle component of some the ion particles with deviation in the incident angle does not meet the channeling condition, a channeling phenomenon due to those ions is inhibited, even if the average incident angle of the beam as a whole meets the channeling condition. It is therefore necessary to control the beam angle distribution accurately in order to control the shape and range of carrier concentration distribution formed in the wafer precisely.

On the other hand, it is difficult to directly and accurately measure the angle distribution of an ion beam incident on a wafer. For example, the angle distribution of an ion beam is calculated by comparing beam shapes measured at different upstream and downstream positions in the beamline, or by transmitting a portion of the beam through a slit and comparing the beam shape downstream of the slit with the slit shape. In other words, the degree of divergence or convergence of the ion beam as a whole is calculated by referring to a change rate of the beam shape in the direction of travel of the beam. If the angle distribution is calculated by referring to a change in the beam shape, however, angle distribution information that does not affect the beam shape greatly (e.g., angle distribution around the center of the beam) cannot be precisely measured. Further, if the angle distribution is changed as a result of neutralization of some ion particles forming the ion beam, angle information on the neutralized particles cannot be obtained because the neutralized particles cannot be measured by a Faraday cup.

Thus, according to the embodiment, beam angle distribution information is evaluated by measuring the sheet resistance of the wafer that the ion beam is incident on, instead of obtaining angle distribution information of the beam by directly measuring the ion beam. More specifically, the angle distribution of an ion beam is evaluated by utilizing the phenomenon that the proportion of ion particles undergoing the channeling effect in the wafer varies depending on the angle distribution of ion particles forming the ion beam and as a result, the resultant sheet resistance of the wafer varies. In particular, the implant angle distribution of the ion beam in the x direction and y direction is evaluated by combining an implantation process that meets a predetermined plane channeling condition and an implantation process that meets a predetermined axial channeling condition. In the embodiment, a highly precise ion implantation process is realized by evaluating the implant angle distribution in the x direction and in the y direction.

A detailed description will now be given of a technology assumed in the embodiment. A description will now be given of an ion implantation apparatus configured to adjust the implant angle distribution of the ion beam by using a prerequisite technology described later.

[Implant Angle Distribution of Ion Beam]

FIGS. 1A-1E are diagrams schematically showing the angle characteristics of an ion beam B incident on a wafer W. All of the figures show that ion beam B is incident perpendicularly on the surface of the wafer W, i.e., the beam B is incident with an incident angle of 0°. However, the ion beams B shown in the respective figures differ in the angle distribution of ion particles forming the beam.

FIG. 1A shows a "divergent beam" with a beam diameter of the ion beam B expanding and diverging toward the wafer W. FIG. 1B shows a case where the ion beam B diverges as in FIG. 1A but with a smaller degree of divergence. FIG. 1C shows a case where the beam diameter of the beam B directed to the wafer W remains unchanged and shows a "parallel beam" in which nearly all of the ion particles forming the ion beam B travel parallel to the beam trajectory. FIG. 1D shows a "convergent beam" with a beam diameter of the ion beam B becoming smaller toward the wafer W. FIG. 1E shows a case where the ion beam B converges as in FIG. 1D but with a larger degree of convergence. Thus, the ion beam B may diverge or converge relative to the reference trajectory of the beam and may have an "angle distribution" indicating variation in angle components of the ion particles, aside from the traveling direction of the beam as a whole.

Figure 2C:
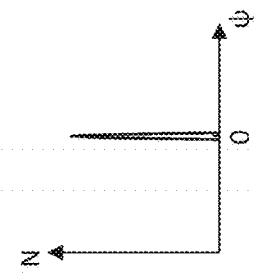
Figure 2D:
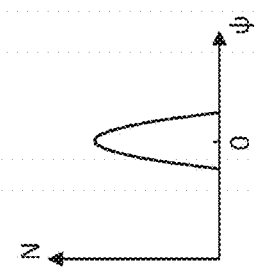
Figure 2E:
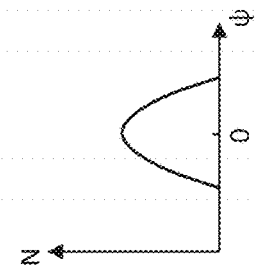

FIGS. 2A-2E are graphs schematically showing the angle distribution of the ion beams B shown in FIG. 1A-1E. The vertical axes of the graphs represent the number of ion particles forming the ion beam B and the horizontal axes represent the angle ψ defined by the traveling direction of ion particles and the traveling direction of the ion beam B. As shown in FIG. 2C, the spread of angle distribution of the ion beam is small if all of the ion particles forming the ion beam B travel in parallel. Meanwhile, as shown in FIGS. 2A and 2E, the spread of angle distribution of the ion beam is large if the divergence or convergence of the ion beam B is large. The degree of spread of angle distribution of ion beam can be quantified by the standard deviation of the angle distribution shown.

The direction of travel of the ion beam as a whole can be defined with reference to the average angle value or the peak angle value of the beam angle distribution. Therefore, the direction of travel of the ion beam B is a direction perpendicular to the wafer W in the examples shown in FIGS. 1A-1E. It should be noted here that the beam trajectory in a direction (z direction) aligned with the direction of travel of the ion beam B may be referred to as "reference trajectory". The incident direction of the ion beam with reference to the target wafer surface (or the principal surface of the wafer) may be referred to as "implant angle". The implant angle is defined by the angle between a normal to the principal surface of the wafer and the direction of the reference trajectory. The angle distribution of the ion beam with reference to the principal surface of the wafer may be referred to as "implant angle distribution".

[Impurity Concentration Distribution Formed in the Wafer]

FIG. 3 schematically shows an impurity region 91 formed in the vicinity of a gate structure 90 by irradiation of the ion beam B. The figure shows an ion implantation process for forming the impurity region 91 serving as a source/drain region in the vicinity of the gate structure 90 by irradiating the wafer W formed with the gate structure 90 on the target wafer surface with the ion beam B. The wafer W is a silicon substrate oriented so that the target wafer surface is a (100) plane. For example, the ion beam B incident into the wafer W is a parallel beam having an implant angle of 0° relative to the target wafer surface and an implant angle distribution with a small spread. For this reason, a majority of ion particles incident on the wafer W are incident along a crystal axis in a <100> orientation of the wafer W and implanted deep in the z direction due to a strong axial channeling effect. As a result, the spread $z_1$ of the impurity region 91 in the depth direction reached by ion particles is relatively large and the spread $L_1$ of the impurity region 91 in the direction of gate length formed by particles spreading below the gate structure 90 is relatively small. It should be noted that the graph on the left of the figure shows a distribution of impurity concentration $N_D$ in the depth direction (z direction) and the graph toward the bottom of the figure shows a distribution of impurity concentration $N_D$ in the direction of gate length.

Figure 4:
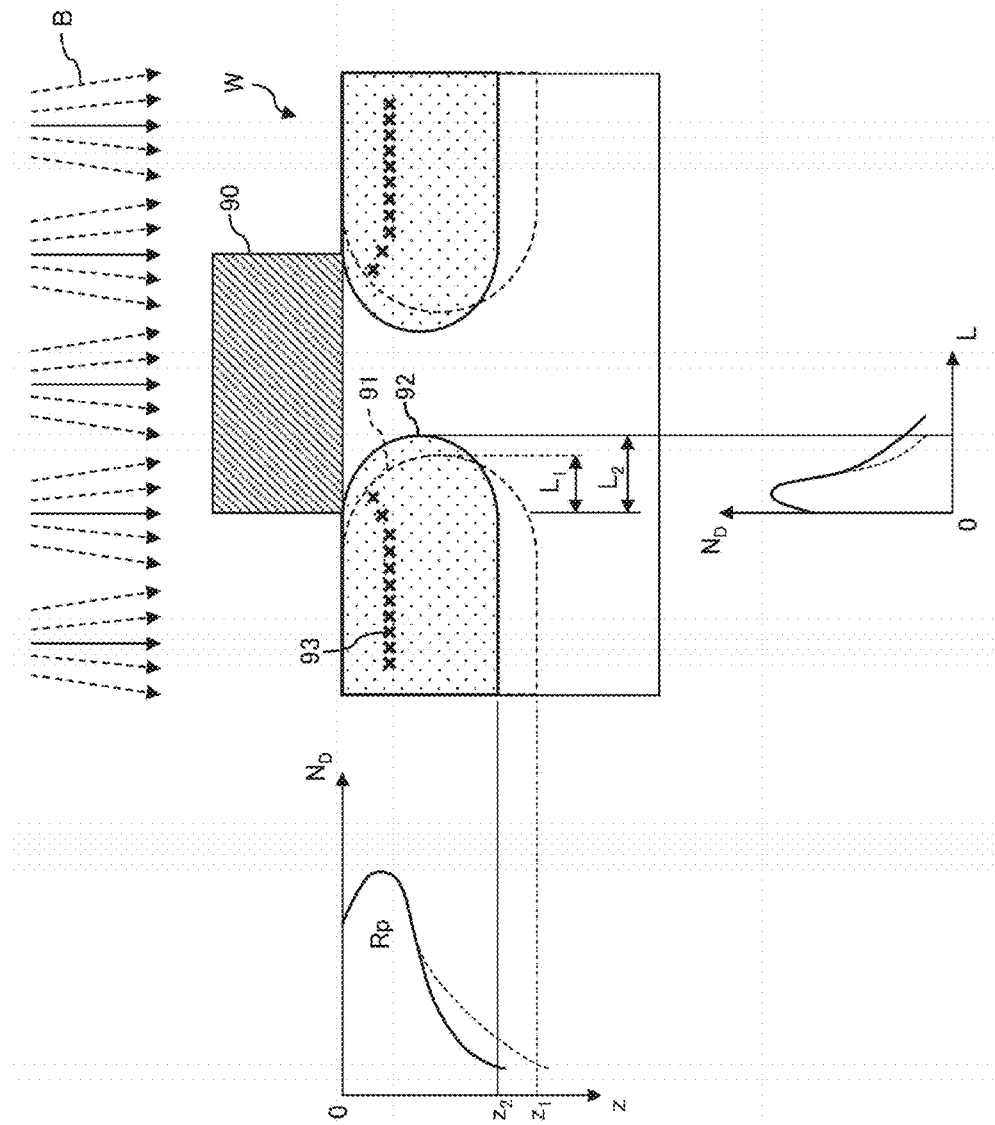
FIG. 4 schematically shows an impurity region formed in the neighborhood of a gate structure by irradiation with the ion beam.

FIG. 4 schematically shows an impurity region 92 formed in the vicinity of the gate structure 90 by irradiation of the ion beam B. The figure differs from FIG. 3 in that the ion beam B incident into the wafer W is a "divergent beam" as shown in FIG. 1A and the implant angle distribution has a certain spread. Since the ion beam B of FIG. 4 is a divergent beam, a channeling phenomenon is less likely to occur as compared to the case of the parallel beam shown in FIG. 3 and the proportion of ions undergoing the channeling effect is smaller. As a result, the spread $z_2$ of the impurity region 92 in the depth direction reached by ion particles is relatively small and the spread $L_2$ of the impurity region 92 in the direction of gate length formed by particles spreading below the gate structure 90 is relatively large. It should be noted that, given the same beam characteristics except for the implant angle distribution, the position of a defect 93 formed by ion implantation and the peak position Rp of the impurity concentration $N_D$ are substantially identical in FIG. 3 and in FIG. 4. Accordingly, the magnitude of spread (distribution) of the impurity region formed in the vicinity of the gate structure 90 in the depth direction and in the direction of gate length can be adjusted by properly controlling the implant angle distribution of the incident ion beam B. The impurity concentration distribution is relatively maintained even if the wafer W is annealed after ion implantation so that the carrier concentration distribution ultimately obtained can be shaped to suit the purpose by controlling the implant angle distribution.

Figure 5:
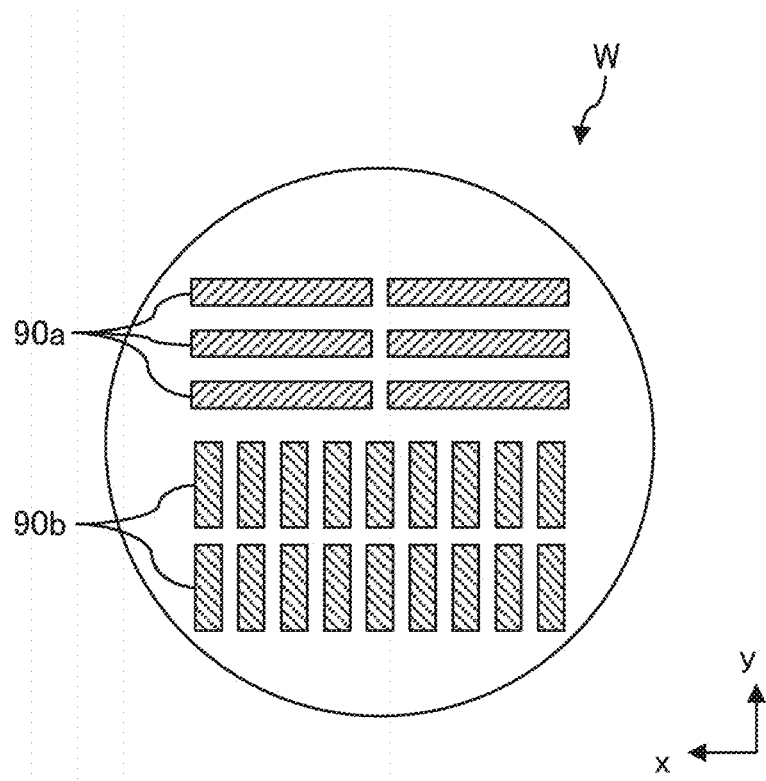
FIG. 5 is a top view schematically showing gate structures formed on the target wafer surface.

It is preferable that the implant angle distribution of the ion beam B be controlled not only in the one dimensional direction but also in the two dimensional directions within the cross section perpendicular to the direction of beam travel. This is because gate structures formed in the same wafer are not oriented in the same direction in general but are arranged in mutually perpendicular directions or mutually intersecting directions. FIG. 5 is a top view schematically showing gate structures formed on the target wafer surface and shows exemplary gate electrodes 90a, 90b formed in the same wafer W. In the illustrated example, a first gate electrode 90a extending in the transversal direction (x direction) on the plane of paper and a second gate electrode 90b extending in the vertical direction (y direction) on the plane of paper are provided. If such a wafer W is irradiated with an ion beam, the spread of the impurity region formed in the vicinity of the first gate electrode 90a in the direction of gate length (y direction) is primarily affected by the implant angle distribution in the y direction. Meanwhile, the spread of the impurity region formed in the vicinity of the second gate electrode 90b in the direction of gate length (x direction) is primarily affected by the implant angle distribution in the x direction. Accordingly, the implant angle distribution in the x direction and in the y direction need to be properly controlled in order to obtain a desired impurity concentration distribution both in the first gate electrode 90a and in the second gate electrode 90b.

[Evaluation of Implant Angle Distribution Using Sheet Resistance]

As described above, the implant angle distribution of the ion beam incident on the wafer beam affects the shape of distribution of the impurity region formed in the wafer and can also affect the carrier concentration distribution in the annealed wafer. Generally, the sheet resistance of the wafer could differ if the carrier concentration distribution in the wafer differs. It is therefore predicted that a certain correlation holds between the implant angle distribution of the irradiated ion beam and the sheet resistance value of the wafer. We therefore considered that the implant angle distribution of the ion beam used for ion implantation can be evaluated by using the sheet resistance of the wafer into which the ions are implanted. In particular, we considered that the implant angle distribution in the x direction and in the y direction may be evaluated by varying the channeling condition in the x direction and in the y direction as viewed from the ion beam by varying the orientation of the wafer.

Figure 6B:
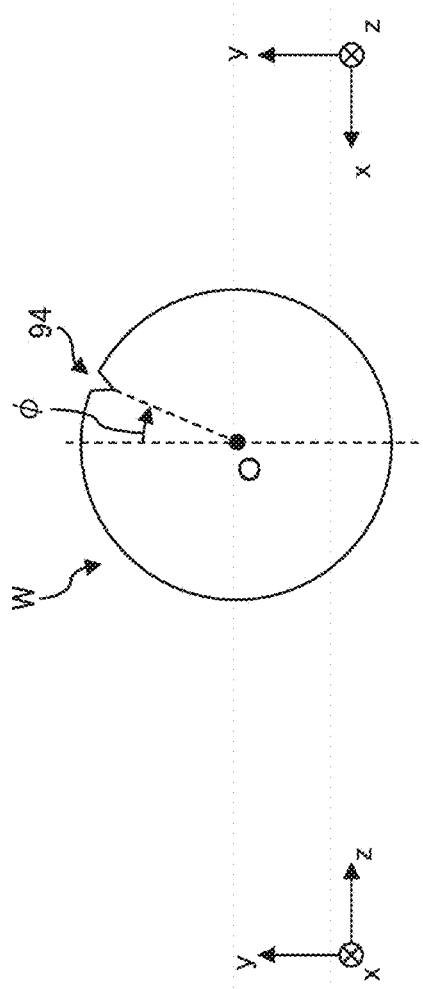
FIGS. 6A and 6B schematically show the orientation of the wafer W relative to the reference trajectory of the ion beam B.
Figure 6A:
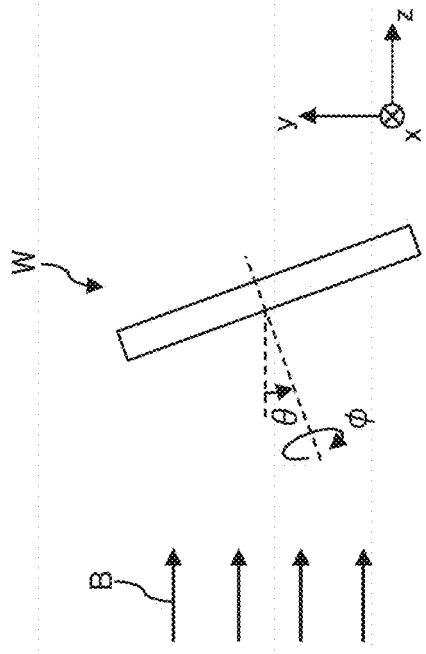

FIGS. 6A and 6B schematically show the orientation of the wafer W relative to the reference trajectory of the ion beam B. FIG. 6A shows a state in which a tilt angle θ is provided by tilting the wafer W relative to the z direction in which the reference trajectory of the beam lies. The tilt angle θ is defined as an angle of rotation of the wafer W rotated around the x axis. The tilt angle θ=0° occurs when the ion beam B is perpendicularly incident on the wafer W. FIG. 6B shows that a twist angle φ is set by rotating the wafer W around an axis perpendicular to the principal surface of the wafer. The twist angle φ is defined as an angle of rotation of the wafer W rotated around an axis perpendicular to the principle surface of the wafer. The twist angle φ=0° occurs when the line extending from the center of the wafer W to an alignment mark 94 is aligned with the y direction. In the embodiment, it is ensured that a predetermined channeling condition results by arranging the wafer W relative to the ion beam B to set the tilt angle θ and the twist angle φ properly.

Figure 7A:
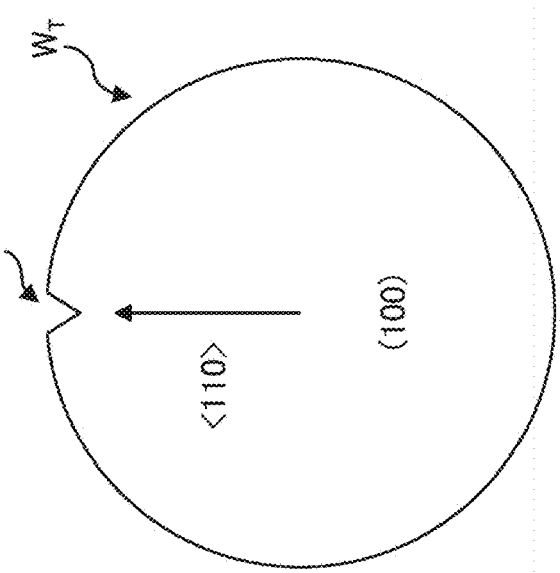
FIGS. 7A and 7B schematically show an evaluation wafer used in evaluating the implant angle distribution.
Figure 7B:
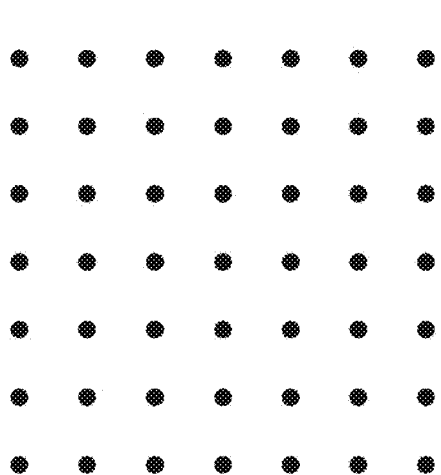

FIGS. 7A and 7B schematically show an evaluation wafer $W_T$ used in evaluating the implant angle distribution. FIG. 7A shows a crystalline orientation of the evaluation wafer $W_T$ and FIG. 7B shows an atomic arrangement in the vicinity of the surface of the evaluation wafer $W_T$. In the embodiment, the evaluation wafer $W_T$ is embodied by a monocrystal silicon substrate in which the principal surface of the wafer is oriented in alignment with a (100) plane. The alignment mark 94 of the evaluation wafer $W_T$ is provided at a position indicating a <110> orientation. The evaluation wafer $W_T$ is a so-called bare wafer and is not provided with gate structures or trench structures for forming a semiconductor circuit.

It is desired that the off angle of the principal surface of the wafer is sufficiently small to realize a strict channeling condition. It is preferable that the off angle should be smaller than that of bare wafers commonly used in manufacturing a semiconductor circuit. More specifically, it is preferable to use a silicon substrate cut out so that the off angle is 0.1° or smaller. The term "off angle" means an angle disagreements between the direction of a normal to the principal surface of the wafer and a <100> orientation of the crystal axis of silicon forming the wafer. If the off angle is 0°, the principal surface of the evaluation wafer $W_T$ is aligned strictly with a (100) plane of the silicon crystal.

FIGS. 8A-8C schematically show atomic arrangements in the vicinity of the surface of the wafer arranged to meet a predetermined channeling condition or an off-channeling condition. The figures show atomic arrangements as seen from the ion beam incident on the wafer. The figures show the positions of silicon atoms with solid circles. Silicon atoms located at different positions in the depth direction (z direction) are depicted as being superimposed on one another within the xy plane.

FIG. 8A shows an atomic arrangement that meets an axial channeling condition and shows the evaluation wafer $W_T$ arranged such that the twist angle φ=23° and the tilt angle θ=0°. In the axial channeling condition as illustrated, a plurality of first crystal planes 96 formed by silicon atoms arranged on solid lines and a plurality of second crystal planes 97 formed by silicon atoms arranged on broken lines intersect each other in a lattice array, forming axial gaps (channeling axis 95) that extend in a one-dimensional direction. Consequently, only those ion particles, in the ion beam having an angle distribution in at least one of the x direction and the y direction, that travel straight in the z direction undergoes the channeling effect. Ion particles having an angular component shifted by a certain degree from the z direction are interfered by one of the crystal planes and does not undergo the channeling effect. Therefore, the wafer arranged to meet the axial channeling condition creates "axial channeling" where ion particles that travel primarily in the axial direction along the reference trajectory of the ion beam undergoes the channeling effect.

The arrangement that meets the axial channeling condition is not limited to the twist angle and tilt angle described above. Other twist angles and tilt angles may be used so long as the wafer arrangement that realizes the atomic arrangement as illustrated results. More specifically, other angular conditions may be used insomuch as the evaluation wafer $W_T$ is arranged so as to include a channeling axis in a direction aligned with the reference trajectory of the ion beam incident on the wafer and not to include a channeling plane parallel or perpendicular to the reference plane defined by the reference trajectory direction (z direction) of the ion beam and the reciprocal movement direction (y direction) of the wafer. In order to realize the axial channeling condition as described above, the twist angle of the evaluation wafer $W_T$ may be substantially within a range 15°-30° and the tilt angle may be substantially 0°.

FIG. 8B shows an atomic arrangement that occurs in an arrangement that meets a plane channeling condition and shows that the evaluation wafer $W_T$ is arranged such that the twist angle φ=0° and the tilt angle θ=15°. In the plane channeling condition as illustrated, a plurality of crystal planes 99 are formed by silicon atoms arranged in the yz plane, and gaps (channeling plane 98) extending two-dimensionally is formed between the crystal planes 99 opposite to each other in the x direction. Consequently, only those ion particles, in the ion beam having an angle distribution in the x direction, that travel straight in the z direction undergoes the channeling effect. Ion particles having an angular component shifted by a certain degree from the z direction to the x direction are interfered by the crystal planes 99 and does not undergo the channeling effect. Meanwhile, the ion beam having an angle distribution in the y direction is not interfered by the crystal planes 99 and undergoes the channeling effect through the gap between the crystal planes 99. Therefore, the wafer arranged to meet the plane channeling condition creates "plane channeling" where ion particles that travel primarily along the reference plane defined by the z direction aligned with the reference trajectory of the ion beam and the y direction does not undergo the channeling effect. Therefore, if the wafer arranged to meet the plane channeling condition is irradiated with the ion beam, direction dependence is created in which ion particles having an angular component in the x direction does not undergo the channeling effect and ion particles having an angular component in the y direction undergo the channeling effect.

The arrangement that meets the plane channeling condition is not limited to the twist angle and tilt angle described above. Other twist angles and tilt angles may be used so long as the wafer arrangement that realizes the atomic arrangement as illustrated results. More specifically, other angular conditions may be used insomuch as the evaluation wafer $W_T$ is arranged so as to include a channeling plane parallel to the reference plane defined by the direction aligned with the reference trajectory of the ion beam incident on the wafer and the y direction and not to include a channeling plane perpendicular to the reference plane. In order to realize the plane channeling condition, the twist angle of the evaluation wafer $W_T$ may be substantially 0° or 45° and the tilt angle may be within a range of 15°-60°.

FIG. 8C shows an atomic arrangement that results in an arrangement that meets an off-channeling condition and shows that the evaluation wafer $W_T$ is arranged such that the twist angle φ=23° and the tilt angle θ=7°. Under the off-channeling condition as illustrated, channels that provide a path for ion particles are not visible. Silicon atoms appear to be thickly disposed in the x direction and the y direction. Consequently, irradiation of the wafer that meets the off-channeling condition with an ion beam does not result in a channeling phenomenon regardless of whether or not ion particles forming the beam have angular components in the x direction and the y direction.

The arrangement that meets the off-channeling condition is not limited to the twist angle and tilt angle described above. Other twist angles and tilt angles may be used so long as the wafer arrangement that realizes the atomic arrangement as illustrated results. More specifically, other angular conditions may be used insomuch as the evaluation wafer $W_T$ is arranged so that low-order crystal planes such as {100} plane, {110} plane, and {111} plane intersect diagonally with the reference trajectory of the ion beam. In order to realize the off-channeling condition, the twist angle of the evaluation wafer $W_T$ may be within a range of 15°-30° and the tilt angle may be within a range of 7°-15°.

The evaluation wafer $W_T$ may also be subject to pre-amorphous process in order to realize the off-channeling condition. In the pre-amorphous process, the wafer is irradiated with an ion beam containing ion species such as silicon (Si) and germanium (Ge) that do not affect the carrier concentration distribution, so as to change the crystal structure in the vicinity of the surface and turn the vicinity of the wafer surface into an amorphous state. By turning the vicinity of the surface into an amorphous state, the regular structure of the crystal is destroyed so that channels that provide a path for ion particles cannot exist. Accordingly, the "off-channeling" condition described above can be realized.

A description will now be given of the sheet resistance of the wafer that results when the evaluation wafer $W_T$ meeting the respective channeling conditions is irradiated with an ion beam. In the embodiment, the evaluation wafer $W_T$ irradiated with an ion beam is annealed and then the sheet resistance of the wafer is measured by using the four-point probe method. The method of measuring the sheet resistance by using the four-point probe method is publicly known so that a detailed description is omitted.

Figure 9:
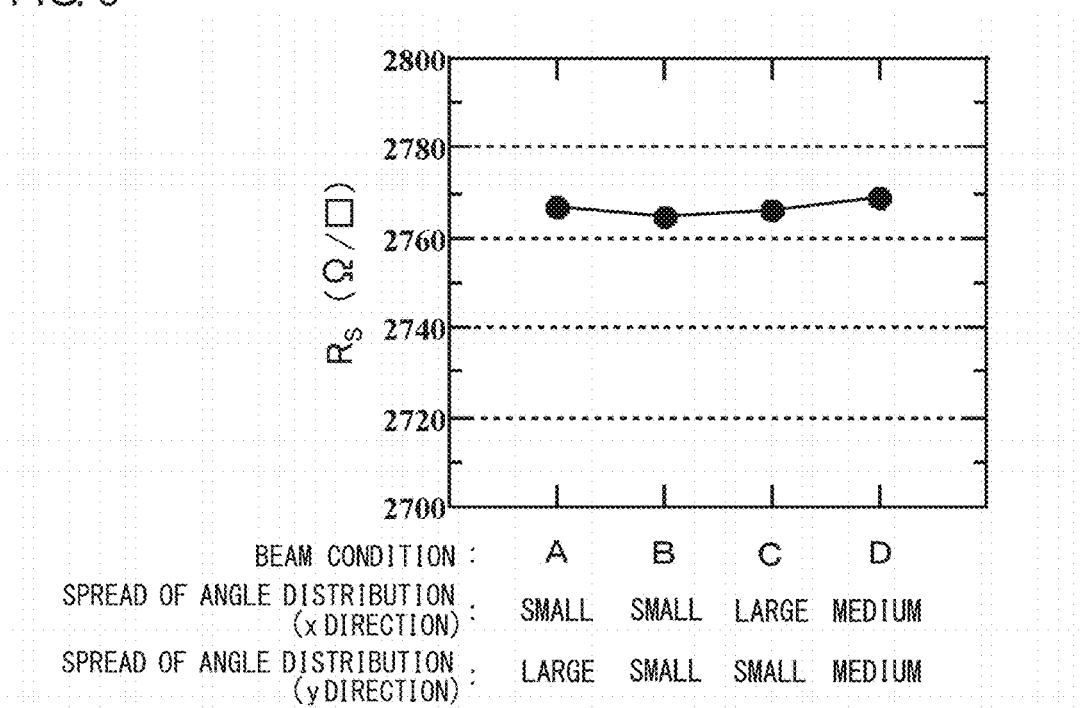
FIG. 9 is a graph showing the sheet resistance of the wafer that results when the wafer in the off-channeling condition is irradiated with an ion beam.

FIG. 9 is a graph showing the sheet resistance $R_s$ of the wafer that results when the wafer in the off-channeling condition is irradiated with an ion beam. The graph plots sheet resistance values obtained when the beam condition in terms of implant angle distribution is varied. The vertical axis of the graph represents sheet resistance values (Ω/□) measured, and the horizontal axis represents different beam conditions A-D. Beam condition A is defined by a small spread of implant angle distribution in the x direction and a large spread of implant angle distribution in the y direction. Beam condition B is defined by a small spread of implant angle distribution in the x direction and the y direction. Beam condition C is defined by a large spread of implant angle distribution in the x direction and a small spread of implant angle distribution in the y direction. Beam condition D is defined by a medium spread of implant angle distribution in the x direction and the y direction. The other implantation conditions such as beam current amount of the ion beam are identical.

As shown in FIG. 9, the sheet resistance values that result as the implant angle distribution of the incident ion beam is varied are similar to each other if the wafer in the off-channeling condition is used. This is considered to be due to the fact that a channeling phenomenon does not occur regardless of the characteristics of beam implant angle distribution. This demonstrates that the implant characteristics that do not depend on the implant angle distribution (e.g., the dose obtained by beam irradiation) can be evaluated by measuring the sheet resistance using the wafer in the off-channeling condition.

Figure 10A:
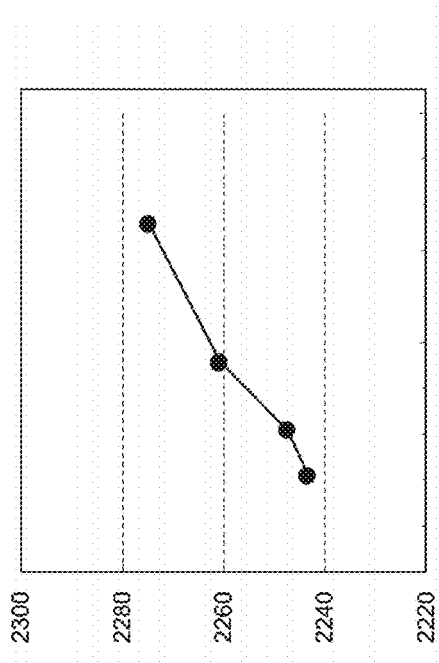
FIGS. 10A and 10B are graphs showing the sheet resistance of the wafer that results when the wafer in a plane channeling condition is irradiated with an ion beam.
Figure 10B:
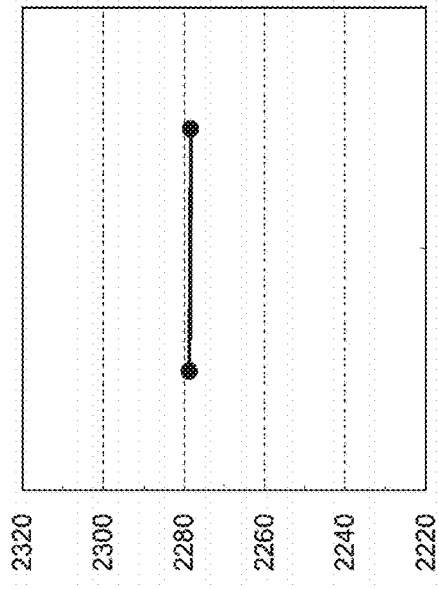

FIGS. 10A and 10B are graphs showing the sheet resistance $R_s$ of the wafer that results when the wafer in the plane channeling condition is irradiated with an ion beam. FIG. 10A shows sheet resistance values obtained when the beam condition in terms of implant angle distribution in the y direction is varied. The vertical axis of the graph represents sheet resistance values (Ω/□) measured, and the horizontal axis represents different beam conditions A, B. Beam condition A is defined by a small spread of implant angle distribution in the x direction and a large spread of implant angle distribution in the y direction. Beam condition B is defined by a small spread of implant angle distribution in the x direction and the y direction. Therefore, the two beam conditions A, B are similar in terms of the spread of implant angle distribution in the x direction and differ in terms of the spread of implant angle distribution in the y direction. As illustrated, the difference in sheet resistance values obtained by irradiating the wafer in the plane channeling condition with ion beams that differ in the spread of implant angle distribution in the y direction is so small that the values are almost identical. In other words, the difference in implant angle distribution in the y direction is hardly reflected in the resultant sheet resistance values when the wafer in the plane channeling condition is irradiated with an ion beam.

FIG. 10B shows sheet resistance values obtained when the beam condition in terms of implant angle distribution in the x direction is varied. The vertical axis of the graph represents sheet resistance values (Ω/□) measured, and the horizontal axis represents standard deviation values (angle) of the spread of implant angle distribution of the incident beam in the x direction. The other implantation conditions such as beam current amount of the ion beam are identical. The graph shows that the sheet resistance value obtained increases as the spread of implant angle distribution in the x direction grows. This is considered to be due to the fact that the number of ion particles channeled in the planar direction and implanted into deeper positions is decreased as the spread of implant angle distribution in the x direction grows. This demonstrates that the spread of implant angle distribution of the beam in the x direction can be evaluated by measuring the sheet resistance using the wafer in the plane channeling condition.

Figure 11:
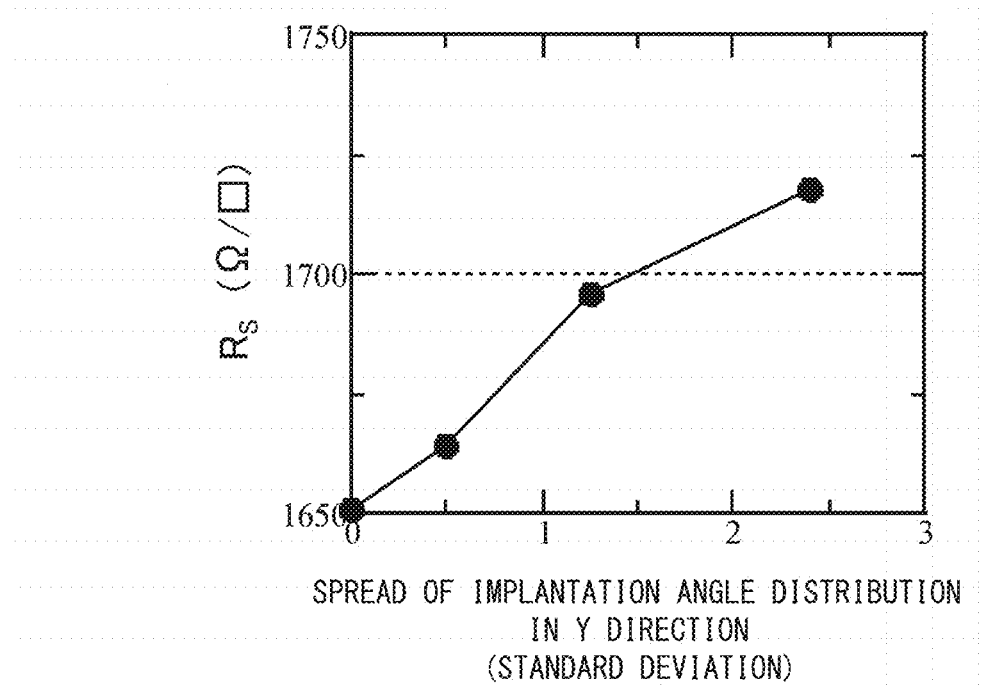
FIG. 11 is a graph showing the sheet resistance of the wafer that results when the wafer in an axial channeling condition is irradiated with an ion beam.

FIG. 11 is a graph showing the sheet resistance $R_s$ of the wafer that results when the wafer in the axial channeling condition is irradiated with an ion beam. The graph shows the sheet resistance obtained when the beam condition in terms of implant angle distribution in the y direction is varied. The vertical axis of the graph represents sheet resistance values (Ω/□) measured, and the horizontal axis represents standard deviation values (angle) of the spread of implant angle distribution of the projected beam in the y direction. The other implantation conditions such as beam current magnitude of the ion beam are identical. The graph shows that the sheet resistance value is increased as the spread of implant angle distribution in the y direction grows. This is considered to be due to the fact that the number of ion particles axially channeled and implanted into deeper positions is decreased as the spread of implant angle distribution grows. This demonstrates that the spread of implant angle distribution of the beam can be evaluated by measuring the sheet resistance using the wafer in the axial channeling condition. Further, the spread of implant angle distribution of the beam in the y direction can be evaluated by analyzing the result along with the result of evaluation under the plane channeling condition described above.

[Configuration of Ion Implantation Apparatus]

Figure 12:
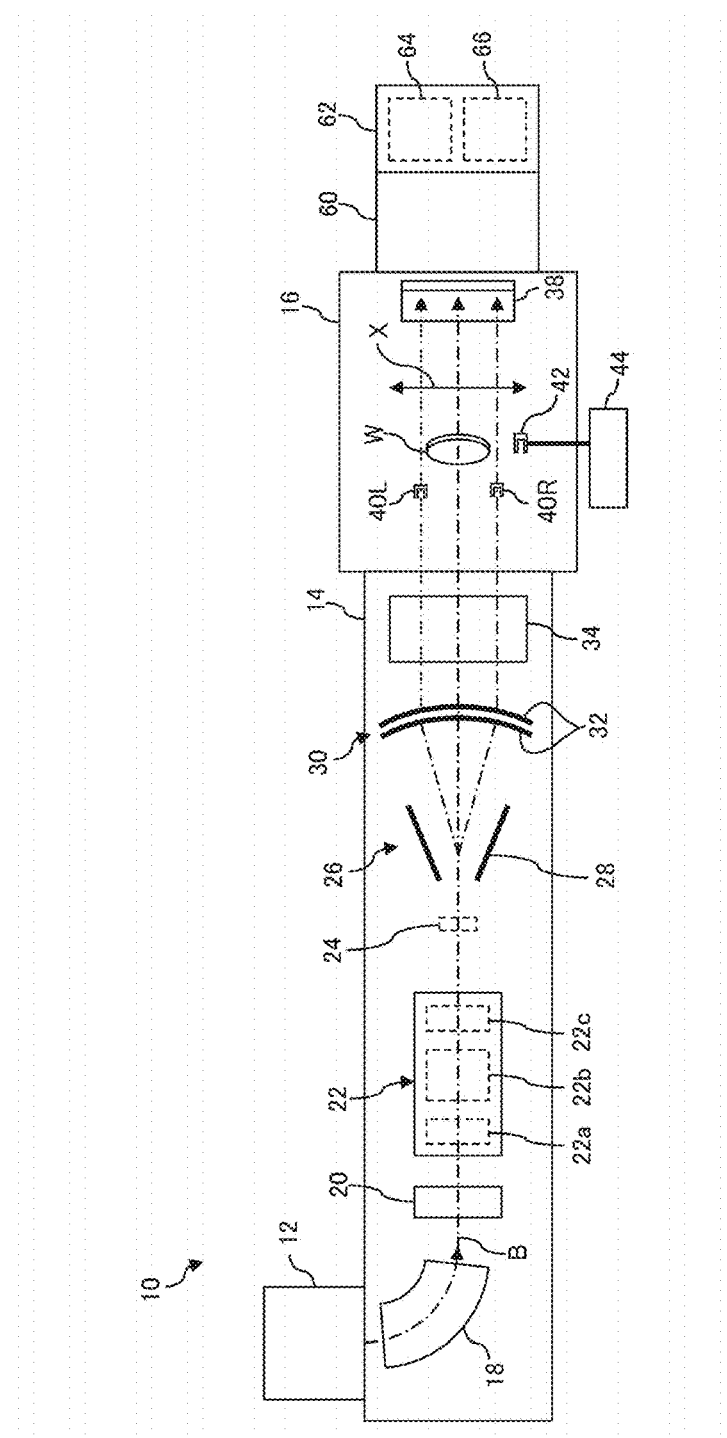
FIG. 12 is a top view schematically showing the ion implantation apparatus according to the embodiment.
Figure 13:
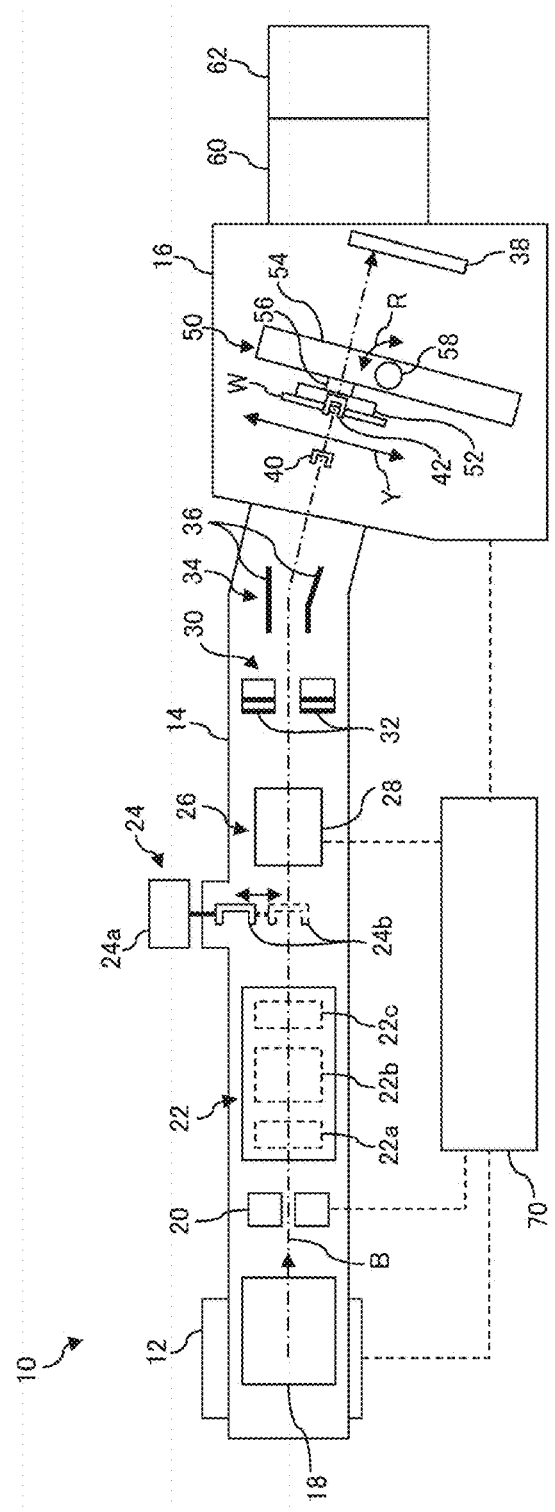
FIG. 13 is a side view showing a schematic structure of the ion implantation apparatus of FIG. 12.

A description will now be given of an ion implantation apparatus 10 using the technology described above. FIG. 12 is a top view schematically showing the ion implantation apparatus 10 according to the embodiment and FIG. 13 is a side view showing a schematic structure of the ion implantation apparatus 10.

The ion implantation apparatus 10 is configured to implant ions into the surface of a target piece W with ions. For example, the target piece W is a substrate and, for example, a semiconductor wafer. In the following description, the target piece W may be referred to as a wafer W for convenience. This does not, however, intend to limit the target of implantation process to a particular object.

The ion implantation apparatus 10 is configured to irradiate the entirety of the wafer W with the ion beam B by scanning a beam reciprocally in one direction and moving the wafer W reciprocally in a direction perpendicular to the one direction. For convenience, the direction of travel of the ion beam traveling on the beam trajectory as designed is defined as the z direction and the plane perpendicular to the z direction is defined as the xy plane in this specification. In case that the target piece W is scanned by the ion beam B, the direction of beam scan is defined as the x direction and the direction perpendicular to the z direction and the x direction is defined as the y direction. Therefore, the reciprocal beam scan takes place in the x direction and the reciprocal movement of the wafer W takes place in the y direction.

The ion implantation apparatus 10 is provided with an ion source 12, a beam line device 14, an implantation chamber 16, a wafer transport chamber 60, a wafer evaluation chamber 62, and a controller 70. The ion source 12 is configured to provide the ion beam B to the beam line device 14. The beam line device 14 is configured to transport ions from the ion source 12 to the implantation chamber 16. The ion implantation apparatus 10 is further provided with a vacuum pumping system (not shown) for providing a desired vacuum environment in the ion source 12, the beam line device 14, the implantation chamber 16, and the wafer transport chamber 60.

For example, the beam line device 14 is provided with a mass analyzer 18, a variable aperture 20, a beam converging unit 22, a first beam meter 24, a beam scanner 26, a collimating lens 30 or a beam collimator, and an angular energy filter (AEF) 34 in the stated order in a direction from upstream to downstream. The term "upstream" in the beam line device 14 means being toward the ion source 12 and the term "downstream" means being toward the implantation chamber 16 (or a beam stopper 38).

The mass analyzer 18 is provided downstream of the ion source 12 and is configured to select necessary ion species from the ion beam B extracted from the ion source 12 by mass analysis.

The variable aperture 20 is an aperture whose aperture width is adjustable. The beam current magnitude of the ion beam B transmitted through the aperture is adjusted by changing the aperture width. The variable aperture 20 may have aperture plates disposed above and below the beam line and adjust the beam current magnitude by changing the spacing between the aperture plates.

The beam converging unit 22 is provided with a convergence lens such as a quadrupole lens (Q lens) and is configured to shape the ion beam B transmitted through the variable aperture 20 to have a desired cross sectional shape. The beam converging unit 22 is a triple-stage quadrupole lens of electric field type (also called a triplet Q lens) and includes a first quadrupole lens 22a, a second quadrupole lens 22b, and a third quadrupole lens 22c in the stated order from upstream to downstream. By using the three lens devices 22a, 22b, and 22c, the beam converging unit 22 is capable of adjusting convergence or divergence of the ion beam B incident on the wafer W in the x direction and in the y direction independently. The beam converging unit 22 may include a lens device of magnetic field type or include a lens device for shaping the beam by using both an electric field and a magnetic field.

The first beam meter 24 is an injector flag Faraday cup retractably disposed on the beam line and configured to measure the current of the ion beam. The first beam meter 24 is configured to measure the beam shape of the ion beam B shaped by the beam converging unit 22. The first beam meter 24 includes a Faraday cup 24b for measuring the beam current and a driver 24a for moving the Faraday cup 24b up and down. As indicated by the broken line in FIG. 13, the ion beam B is shielded by the Faraday cup 24b when the Faraday cup 24b is disposed on the beam line. Meanwhile, when the Faraday cup 24b is removed from the beam line, shielding of the ion beam B is canceled as indicated by the solid line in FIG. 13.

The beam scanner 26 is configured to provide a reciprocal beam scan and is a deflecting means for scanning the shaped ion beam B in the x direction. The beam scanner 26 includes a pair of scan electrodes 28 opposite to each other in the x direction. The pair of scan electrodes 28 are connected to a variable voltage power supply (not shown) and deflects the ion beam B at various angles, by changing the voltage applied to the pair of scan electrodes 28 periodically and changing the electric field induced between the electrodes accordingly. Thereby, the ion beam B is scanned over a scan range in the x direction. The arrow X in FIG. 12 shows an illustrative scan direction and scan range of the beam. A plurality of trajectories of the ion beam B in the scan range are indicated by the dashed line.

The collimating lens 30 is configured to control the direction of travel of the scanned ion beam B to be parallel to the beam trajectory as designed. The collimating lens 30 includes a plurality of arc-shaped parallelizing lens (P lens) electrodes 32 provided with a slit at the center to transmit the ion beam. The P lens electrodes 32 are connected to a high-voltage power supply (not shown) and aligns the direction of travel of the ion beam B to be parallel by applying the electric field created by the voltage application to the ion beam B. The collimating lens 30 may be replaced by an alternative beam collimator. The beam collimator may be configured as a magnetic device that utilizes a magnetic field. An accel/decel (AD) column (not shown) for accelerating or decelerating the ion beam B may be provided downstream of the collimating lens 30.

The angular energy filter (AEF) 34 is configured to analyze the energy of the ion beam B and deflect ions with desired energy downward, guiding the deflected ions to the implantation chamber 16. The angular energy filter 34 includes a pair of AEF electrodes 36 for deflection by the electric field. The pair of AEF electrodes 36 are connected to a high-voltage power supply (not shown). Referring to FIG. 13, by applying a positive voltage to the AEF electrode above and applying a negative voltage to the AEF electrode below, the ion beam B is deflected downward from the beam trajectory. The angular energy filter 34 may be configured as a magnetic device for deflection by a magnetic field. A pair of AEF electrodes for deflection by an electric field and a magnetic device may be used in combination.

In this way, the beam line device 14 supplies the implantation chamber 16 with the ion beam B to irradiate the wafer W.

As shown in FIG. 13, the implantation chamber 16 is provided with a platen driver 50 for supporting one or a plurality of wafers W. The platen driver 50 includes a wafer support 52, a reciprocal movement mechanism 54, a twist angle adjustment mechanism 56, and a tilt angle adjustment mechanism 58. The wafer support 52 is provided with an electrostatic chuck for supporting the wafer W. The reciprocal movement mechanism 54 moves the wafer supported by the wafer support 52 reciprocally in the y direction perpendicular to the beam scan direction (x direction). Referring to FIG. 13, the arrow Y denotes an exemplary reciprocal movement of the wafer W.

The twist angle adjustment mechanism 56 is a mechanism for adjusting the angle of rotation of the wafer W and adjusts the twist angle between the alignment mark provided on the outer circumference of the wafer and the reference position by rotating the wafer W around a normal to the target wafer surface. The alignment mark of the wafer is exemplified by a notch or orientation flat provided on the outer circumference of the wafer to serve as a reference of the angular position in the crystal axis direction of the wafer or in the circumferential direction of the wafer. As illustrated, the twist angle adjustment mechanism 56 is provided between the wafer support 52 and the reciprocal movement mechanism 54 and is reciprocally moved along with the wafer support 52.

The tilt angle adjustment mechanism 58 is a mechanism for adjusting the tilt of the wafer W and adjusts the tilt angle between the direction of travel of the ion beam B directed to the target wafer surface and a normal to the target wafer surface. Of the tilt angles of the wafer W, the angle around an axis aligned with the x direction is defined as the tilt angle. The tilt angle adjustment mechanism 58 is provided between the reciprocal movement mechanism 54 and the inside wall of the implantation chamber 16 and is configured to adjust the tilt angle of the wafer W by rotating the entirety of the platen driver 50 including the reciprocal movement mechanism 54 in the R direction.

The implantation chamber 16 is provided with a beam stopper 38. If the substrate W is not located on the ion beam trajectory, the ion beam B is incident on the beam stopper 38. The implantation chamber 16 is also provided with a second beam meter 44 for measuring the beam current magnitude and the beam current density distribution of the ion beam. The second beam meter 44 is provided with side cups 40R and 40L and a center cup 42.

The side cups 40R and 40L are displaced from the wafer W in the x direction and are placed at positions that do not interfered the ion beam directed to the wafer W while the ions are implanted into the wafer. The ion beam B overscans beyond the position where the wafer W is located so that a portion of the scanning beam is incident on the side cups 40R and 40L during ion implantation. This allows measurement of the ion irradiation dose during the ion implantation process. The measurement values from the side cups 40R and 40L are delivered to the second beam meter 44.

The center cup 42 is for measuring the beam current density distribution on the surface of the wafer W (target wafer surface). The center cup 42 is movable and is removed from the implant position of the wafer during ion implantation and is inserted into the wafer position while the wafer W is not at the position of irradiation. The center cup 42 measures the beam current magnitude while being moved in the x direction and measures the beam current density distribution in the beam scan direction. The center cup 42 is configured to measure the beam shape of the ion beam B at the position of the target wafer surface. Measurement values of the center cup 42 are delivered to the second beam meter 44. The center cup 42 may be formed as an array including a plurality of Faraday cups arranged in the x direction so as to be capable of measuring the ion irradiation dose at a plurality of positions in the beam scan direction at the same time.

The wafer transport chamber 60 is provided at a position adjacent to the implantation chamber 16. The wafer transport chamber 60 is where the pre-processing wafer into which the ions are not yet implanted is prepared for transportation into the implantation chamber 16, and the processed wafer into which the ions are implanted is transported from the implantation chamber 16. The wafer transport chamber 60 is provided with a load lock chamber for transporting the wafer under atmospheric pressure into the implantation chamber 16 in a high-vacuum state and with a transport robot for transporting one or a plurality of wafers.

The wafer evaluation chamber 62 is a place where the sheet resistance of the wafer implanted with ions in the implantation chamber 16 is measured. The wafer evaluation chamber 62 is provided at a position adjacent to the wafer transport chamber 60 and is configured to receive the processed wafer via the wafer transport chamber 60. The wafer evaluation chamber 62 includes a sheet resistance meter 64 for measuring the sheet resistance of the processed wafer and an annealing apparatus 66 for annealing the processed wafer before the sheet resistance is measured. For example, the sheet resistance meter 64 is configured to measure the sheet resistance of the wafer by the four-point probe method. The annealing device 66 is configured to anneal the wafer at a relatively low temperature of 900° C.-1000° C. so as to inhibit variation in the concentration distribution of implanted impurities due to diffusion during annealing.

Figure 14B:
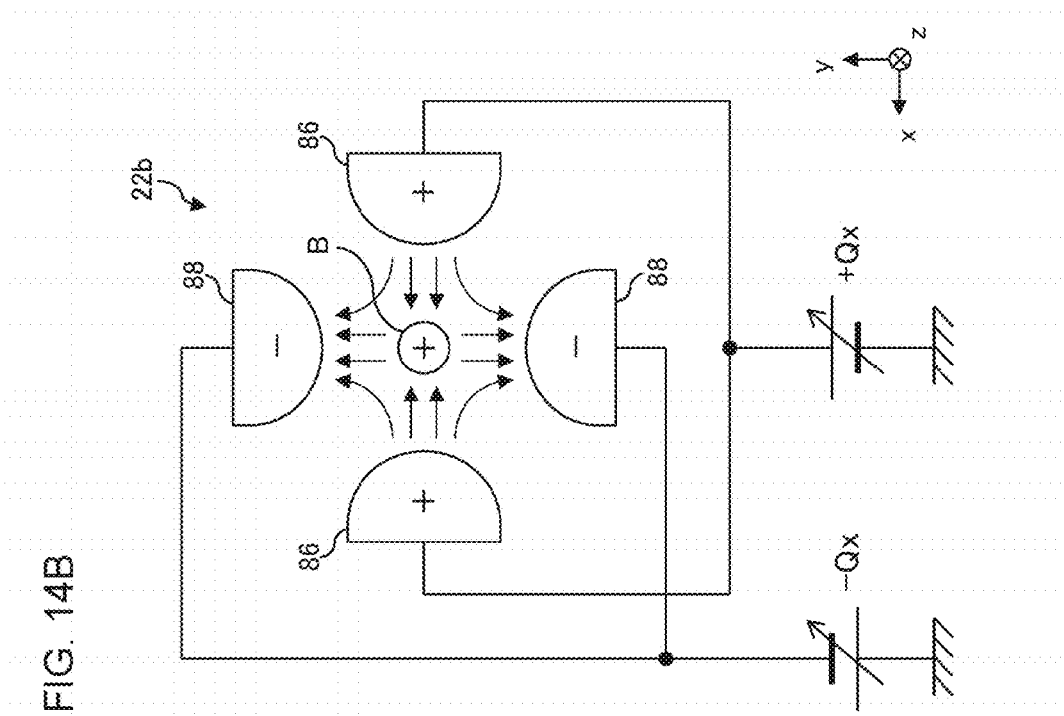
FIGS. 14A and 14B schematically show a configuration of the lens apparatus.
Figure 14A:
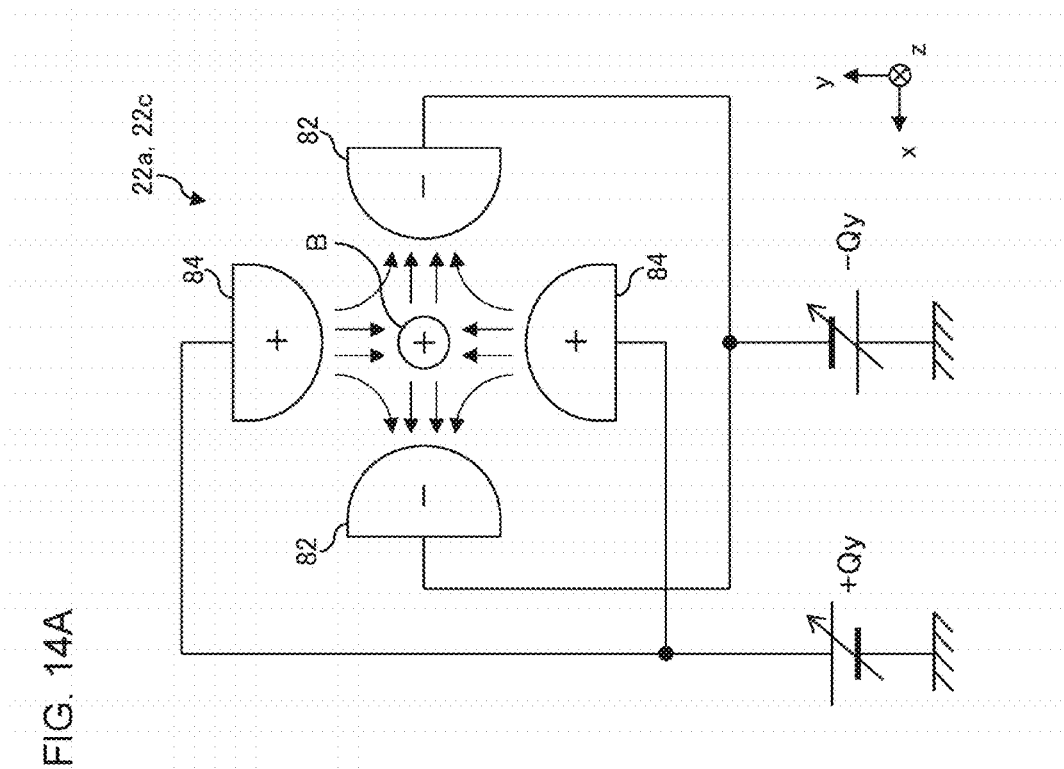

FIGS. 14A and 14B schematically show a configuration of the lens device. FIG. 14A shows a configuration of the first quadrupole lens 22a and the third quadrupole lens 22c for converging the ion beam B in the vertical direction (y direction), and FIG. 14B shows a configuration of the second quadrupole lens 22b for converging the ion beam B in the horizontal direction (x direction).

The first quadrupole lens 22a of FIG. 14A includes a pair of horizontally opposed electrodes 82 opposite to each other in the horizontal direction (x direction) and a pair of vertically opposed electrodes 84 opposite to each other in the vertical direction (y direction). A negative potential −Qy is applied to the pair of horizontally opposed electrodes 82 and a positive potential +Qy is applied to the vertically opposed electrodes 84. The first quadrupole lens 22a induces an attractive force between the ion beam B formed by positively charged ion particles and the horizontally opposed electrodes 82 at a negative potential and induces a repulsive force between the ion bean B and the vertically opposed electrodes 84 at a positive potential. This allows the first quadrupole lens 22a to shape the beam so that the ion beam B is diverged in the x direction and converged in the y direction. The third quadrupole lens 22c is configured similarly as the first quadrupole lens 22a and is applied with the same potential as the first quadrupole lens 22a.

The second quadrupole lens 22b of FIG. 14B includes a pair of horizontally opposed electrodes 86 opposite to each other in the horizontal direction (x direction) and a pair of vertically opposed electrodes 88 opposite to each other in the vertical direction (y direction). The second quadrupole lens 22b is configured similarly as the first quadrupole lens 22a but the applied potential is opposite in polarity. A positive potential +Qx is applied to the pair of horizontally opposed electrodes 86 and a negative potential −Qx is applied to the vertically opposed electrodes 88. The second quadrupole lens 22b induces a repulsive force between the ion beam B formed by positively charged ion particles and the horizontally opposed electrodes 86 at a positive potential and induces an attractive force between the ion bean B and the vertically opposed electrodes 88 at a negative potential. This allows the second quadrupole lens 22b to shape the beam so that the ion beam B is converged in the x direction and diverged in the y direction.

Figure 15:
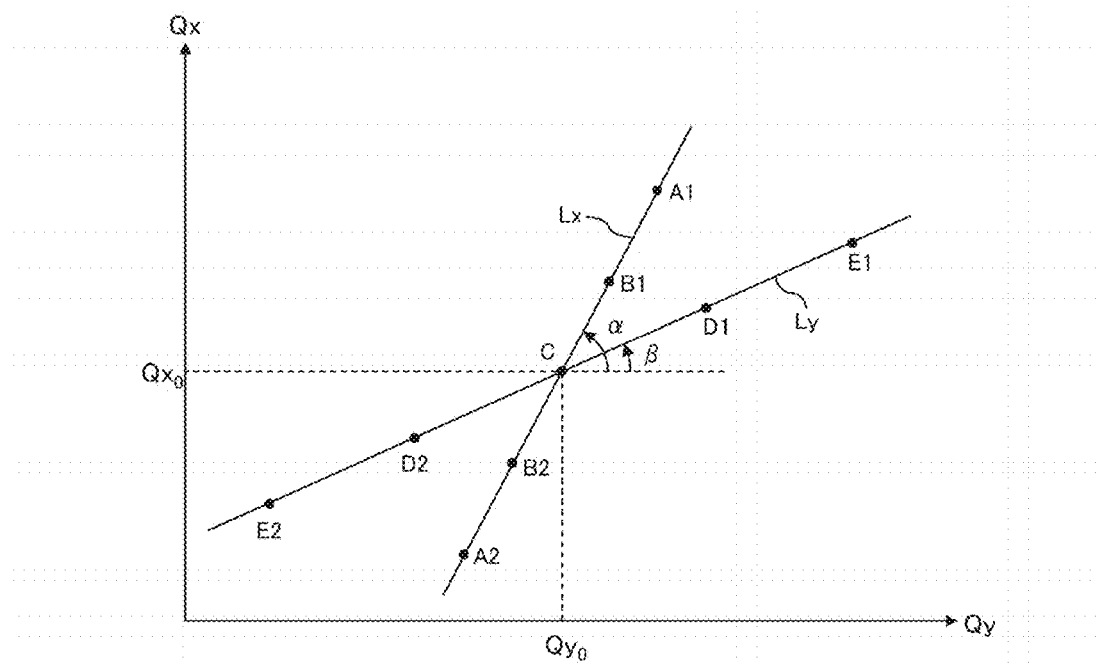
FIG. 15 is a graph schematically showing an example of controlling the lens device.

FIG. 15 is a graph schematically showing an example of controlling the lens device and shows a relationship between the potential Qx, Qy applied to the opposed electrodes of the lens device and the angle distribution of the shaped beam. The vertically converging potential Qy in the horizontal axis represents the potential applied to the first quadrupole lens 22a and the third quadrupole lens 22c and the horizontally converging potential Qx in the vertical axis shows the potential applied to the second quadrupole lens 22b. FIGS. 16A-16E are graphs schematically showing the implant angle distribution of the ion beam adjusted by the lens device. The top graphs show the implant angle distribution in the x direction and the bottom graphs show the implant angle distribution in the y direction. The graphs shown in FIGS. 16A-16E respectively show plots that result when the potentials at the points A1/A2, points B1/B2, point C, points D1/D2, and points E1/E2 of FIG. 15 are used.

Figure 16:
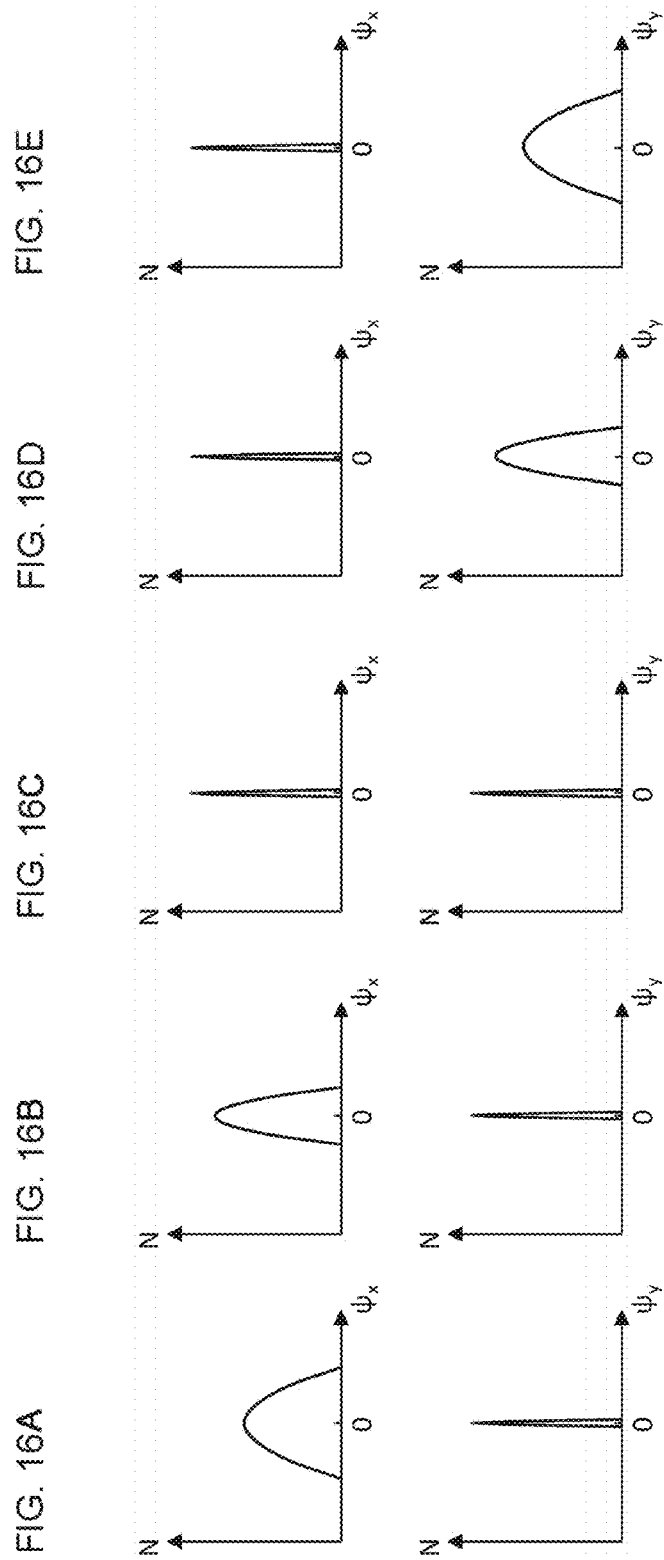
FIGS. 16A-16E are graphs schematically showing the implant angle distribution of the ion beam adjusted by the lens device.

As shown in FIG. 16C, the point C where predetermined potentials $Qx_0$ and $Qy_0$ are applied represents an operating condition that produces a "parallel beam" with a small spread of the implant angle distribution both in the x direction and in the y direction. By varying the potentials Qx and Qy along the straight line Lx from the point C, the beam can be adjusted so as to change the implant angle distribution only in the x direction and not to change the implant angle distribution in the y direction. By increasing the horizontally converging potential Qx from the point C toward the points B1 and A1, the beam is turned into a "convergent beam" converged in the x direction and the spread of the implant angle distribution in the x direction is increased. On the other hand, by decreasing the horizontally converging potential Qx from the point C toward the points B2 and A2, the beam is turned into a "divergent beam" diverged in the x direction and the spread of the implant angle distribution in the x direction is increased.

Similarly, by varying the potentials Qx and Qy along the straight line Ly from the point C, the beam can be adjusted so as to change the implant angle distribution only in the y direction and not to change the implant angle distribution in the x direction. By increasing the vertically converging potential Qy from the point C toward the points D1 and E1, the beam is turned into a "convergent beam" converged in the y direction and the spread of the implant angle distribution in the y direction is increased. On the other hand, by decreasing the vertically converging potential Qy from the point C toward the points D2 and E2, the beam is turned into a "divergent beam" diverged in the y direction and the spread of the implant angle distribution in the y direction is increased.

Thus, by varying the potentials Qx, Qy respectively applied to the lens s in three stages under a certain condition, the implant angle distribution of the ion beam irradiating the wafer W can be independently controlled in the x direction and in the y direction. For example, if it is desired to adjust the implant angle distribution only in the x direction, the potential may be varied to suit the tilt of the straight line Lx so that the relationship $\Delta Qx = \alpha \cdot \Delta Qy$ is maintained. Similarly, if it is desired to adjust the implant angle distribution only in the y direction, the potential may be varied to suit the tilt of the straight line Ly so that the relationship $\Delta Qx = \beta \cdot \Delta Qy$ is maintained. The values of tilt $\alpha$, $\beta$ of the straight lines Lx, Ly are defined as appropriate in accordance with the optical property of the lens devices used.

The controller 70 controls the operation of the devices constituting the ion implantation apparatus 10. The controller 70 receives the setting for the implantation condition of the ion implantation process desired to be performed. As the implantation condition, the controller 70 receives the ion species, implantation energy, beam current magnitude, dose within the wafer surface, tilt angle, twist angle, etc. Further, the controller 70 receives the setting related to the implant angle distribution of the ion beam.

The controller 70 determines the operating parameters of the devices so that the implantation condition thus set is implemented. The controller 70 determines the gas species of the ion source 12, extraction voltage of the ion source 12, value of magnetic field of the mass analyzer 18, etc. as parameters for adjusting the ion species. The controller 70 determines the extraction voltage of the ion source 12, voltage applied to the P lens electrodes 32, value of the voltage applied to the AD column, etc., as parameters for adjusting the implantation energy. The controller 70 determines parameters like the gas flow of the ion source 12, arc current, arc voltage, and source magnet current, etc. and parameters for adjusting the aperture width of the variable aperture 20, as parameters for adjusting the beam current magnitude. Further, the controller 70 determines scan parameters of the beam scanner 26 and speed parameters of the platen driver 50, as parameters for adjusting the dose and/or dose distribution within the wafer surface.

The controller 70 performs a test irradiation process of irradiating the evaluation wafer $W_T$ arranged to meet a predetermined channeling condition with an ion beam so as to evaluate the implant angle distribution of the ion beam. The controller 70 places the evaluation wafer $W_T$ so as to meet the plane channeling condition, axial channeling condition, or off-channeling condition and performs an ion implantation process on the evaluation wafer $W_T$ thus placed. The controller 70 transports the evaluation wafer $W_T$ subject to test irradiation to the wafer evaluation chamber 62 and subjects the wafer $W_T$ to the annealing process and measurement of the sheet resistance in the wafer evaluation chamber 62.

The controller 70 adjusts the implant angle distribution of the ion beam to have a desired distribution by using the result of measuring the sheet resistance. The controller 70 controls the implant angle distribution of the ion beam in the x direction and in the y direction independently, by adjusting the values of the horizontally converging potential Qx and the vertically converging potential Qy applied to the three lens devices 22a, 22b, and 22c of the beam shaper 22. The controller 70 irradiates the target wafer with the ion beam with the adjusted implant angle distribution and performs a real irradiation process that forms a desired carrier concentration distribution in the target wafer.

A description will now be given of specific exemplary adjustment of the ion beam. The description below concerns an adjustment method for calibrating the beam characteristics of the ion beam generated in the ion implantation apparatus 10, and, particularly, the characteristics related to the implant angle distribution. The adjustment method is a method for causing that the characteristics of the first ion beam output from the ion implantation apparatus 10 to agree with the characteristics of the second ion beam output from another ion implantation apparatus that serves as a reference (hereinafter, also referred to as a reference device).

The method according to the exemplary adjustment includes the first step of matching the dose of the ion beam, the second step of matching the reference value of the implant angle of the ion beam, the third step of matching the implant angle distribution of the ion beam in the x direction, and the fourth step of matching implant angle distribution of the ion beam in the y direction.

In the first step, the off-channeling condition described above is used. When the wafer is irradiated with the ion beam in the off-channeling condition, variation in the sheet resistance according to the implant angle distribution in the x direction and the y direction is not seen so that the dose implanted into the wafer by beam irradiation can be compared. In the first step, the evaluation wafer $W_T$ in the off-channeling condition is irradiated with the ion beam by using the ion implantation apparatus 10 and the sheet resistance of the wafer annealed after being irradiated with the beam is measured. Further, the evaluation wafer $W_T$ in the off-channeling condition is irradiated with the ion beam also in the reference apparatus and the sheet resistance of the wafer annealed after being irradiated with the beam is measured. The results of measuring the sheet resistance values are compared and the parameters for setting the dose of the ion implantation apparatus 10 are adjusted so that the difference in the sheet resistance values is eliminated, if any.

In the second step, a method called "V curve method" is used in which the axial channeling condition is taken advantage of. In the V-curve method, the tilt angle of the evaluation wafer $W_T$ is slightly changed around 0° in some irradiations of the wafers with the beam and the direction of the reference trajectory of the beam is estimated by referring to the value of the tilt angle that minimizes the sheet resistance value. Specifically, the tilt angle θ is varied in a range −2°-+2° for example around an orientation that meets the axial channeling condition where the twist angle φ=23° and the tilt angle θ=0°. The sheet resistance of the evaluation wafer $W_T$ irradiated with the ion beam at the respective tilt angles is measured.

Figure 17:
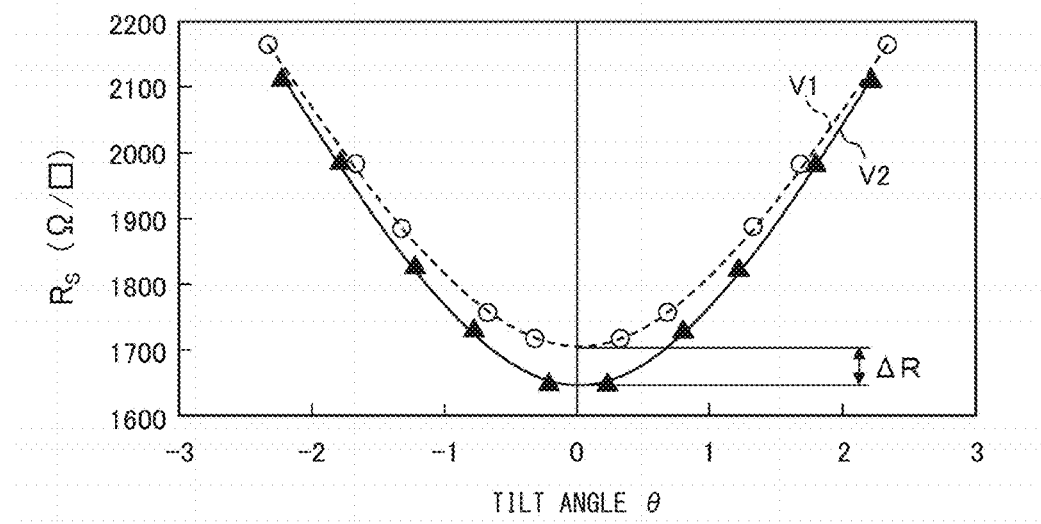
FIG. 17 is a graph showing an example of measuring the sheet resistance according to the V-curve method.

FIG. 17 is a graph showing an example of measurement according to the V-curve method and shows a measurement result V1 of the first ion beam in the ion implantation apparatus 10 and a measurement result V2 of the second ion beam in the reference apparatus. As shown in the graph, the tilt angle dependency of sheet resistance is obtained by approximating a plurality of measurement plots by a V-shaped curve. In the example of the graph, the minimum value of sheet resistance occurs when the tilt angle θ=0° and when there is no angle disagreement between the reference value of the tilt angle (e.g., θ=0°) and the direction of the reference trajectory of the beam. If it is detected that there is a difference in tilt angle between the apparatuses as a result of measurement according to the V-curve method, the tilt angle of the ion implantation apparatus 10 is adjusted to agree with the tilt angle of the reference apparatus. More specifically, the reference values of the implant angle of the beam (the average incident angle of the beam as a whole on the wafer) are adjusted to agree between the apparatuses by adjusting at least one of the tilt angle and the direction of the reference trajectory of the beam on the ion implantation apparatus 10. For example, the disagreement in tilt angle in comparison to the reference apparatus may be compensated by adding a predetermined offset to the reference value on the tilt angle of the ion implantation apparatus 10. Alternatively, the disagreement in the direction of beam trajectory in comparison to the reference apparatus may be compensated by varying the direction of the reference trajectory on the ion implantation apparatus 10 by adjusting parameters of the beam line device 14.

The graph of FIG. 17 shows that a difference ΔR is created in the minimum value of sheet resistance between the two measurement results V1 and V2. The difference ΔR in resistance value is caused by a difference in implant angle distribution between the first ion beam and the second ion beam. It means that the implant angle distribution of the first ion beam characterized by a larger minimum value of sheet resistance is larger than that of the second ion beam characterized by a smaller minimum value of sheet resistance. If the difference ΔR in sheet resistance values is found, the third and fourth steps are carried out to adjust the implant angle distributions of the apparatuses to agree. If the minimum values of sheet resistance in the apparatuses are substantially equal or if the difference in minimum value of sheet resistance is within a criterion range, adjustment of the implant angle distribution through the third and fourth steps described below may be omitted.

In the third step, the implant angle distribution in the x direction is evaluated by using the plane channeling condition described above. The evaluation wafer $W_T$ in the plane channeling condition is irradiated with the ion beam by using the ion implantation apparatus 10 and the sheet resistance of the wafer annealed after being irradiated with the beam is measured. The evaluation wafer $W_T$ in the plane channeling condition is irradiated with the ion beam also in the reference apparatus and the sheet resistance of the wafer annealed after being irradiated with the beam is measured. The results of measuring sheet resistance values are compared. If there is any difference, the operating parameter of the beam shaper 22 is adjusted so that the difference in sheet resistance values is eliminated. Specifically, the voltages Qx, Qy applied to the lens devices are adjusted so as to maintain the relationship of $\Delta Qx = \alpha \cdot \Delta Qy$ so that a desired implant angle distribution in the x direction results.

In the fourth step, the implant angle distribution in the y direction is evaluated by using the axial channeling condition described above. The evaluation wafer $W_T$ in the axial channeling condition is irradiated with the ion beam by using the ion implantation apparatus 10 and the sheet resistance of the wafer annealed after being irradiated with the beam is measured. The evaluation wafer $W_T$ in the axial channeling condition is irradiated with the ion beam also in the reference apparatus and the sheet resistance of the wafer annealed after being irradiated with the beam is measured. The results of measuring the sheet resistance values are compared. If there is any difference, the operating parameter of the beam shaper 22 is adjusted so that the difference in sheet resistance value is eliminated. Specifically, the voltages Qx, Qy applied to the lens devices are adjusted so as to maintain the relationship of $\Delta Qx = \beta \cdot \Delta Qy$ so that a desired implant angle distribution in the y direction results.

Figure 18:
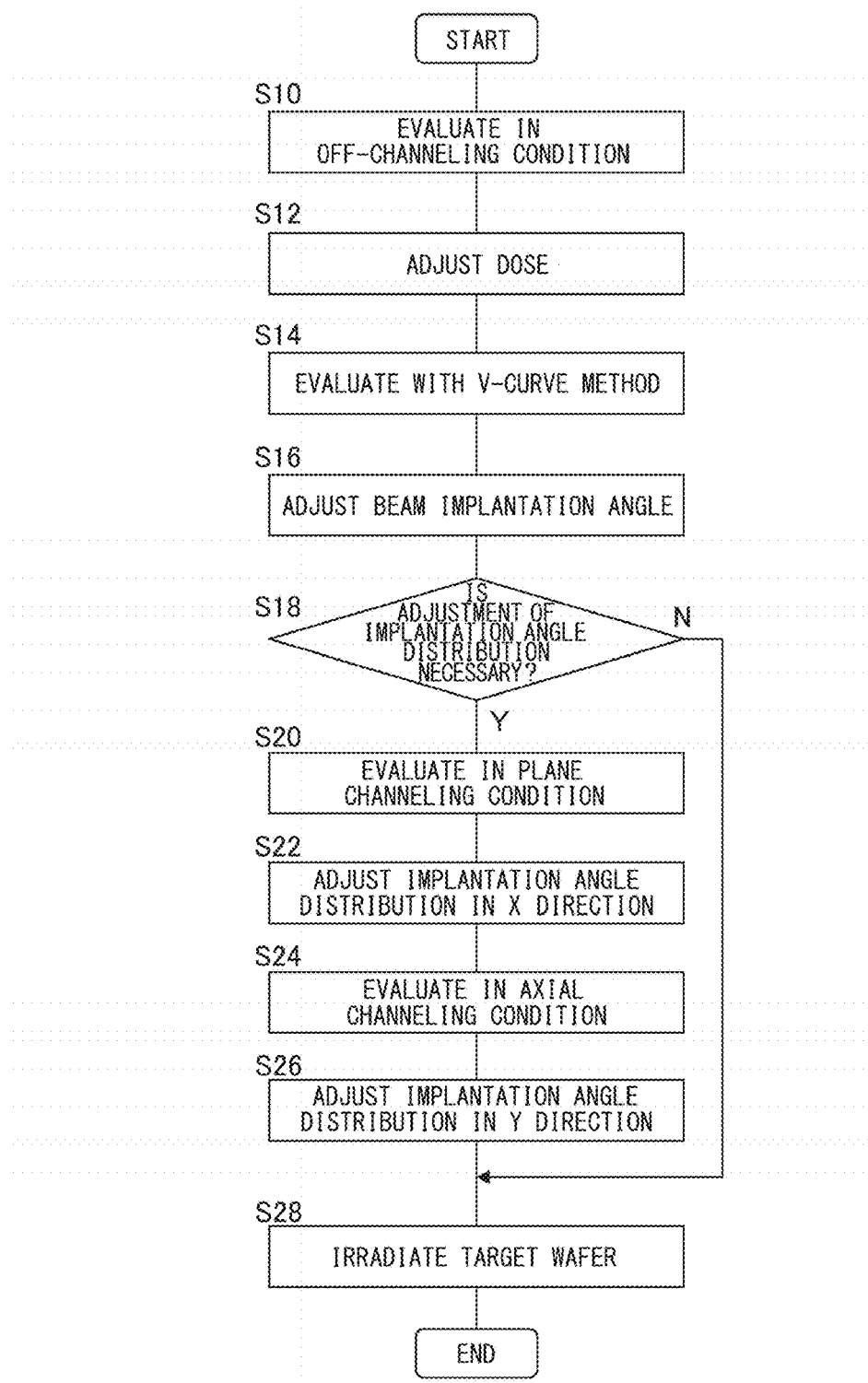
FIG. 18 is a flowchart showing the steps of operation in the ion implantation apparatus according to the embodiment.

FIG. 18 is a flowchart showing the steps of operation in the ion implantation apparatus 10. The dose of the ion beam is evaluated in the off-channeling condition (S10) and the dose is adjusted accordingly (S12). The implant angle of the beam is evaluated by using the V-curve method (S14) and the reference value of the implant angle is adjusted accordingly (S16). If it is necessary to adjust the implant angle distribution (Y in S18), the implant angle distribution of the ion beam in the x direction is evaluated in the plane channeling condition (S20) so that the implant angle distribution in the x direction is adjusted accordingly (S22). The implant angle distribution of the beam in the y direction is evaluated in the axial channeling condition (S24) so that the implant angle distribution in the y direction is adjusted accordingly (S26). If it is not necessary to adjust the implant angle distribution (N in S18), S20-S26 are skipped. Subsequently, the wafer is irradiated with the adjusted ion beam so as to perform the ion implantation process (S28).

The adjustment method according to the embodiment is capable of calibration whereby the dose of the first ion beam, direction of the reference trajectory, and implant angle distribution in the x direction and in the y direction on the ion implantation apparatus 10 agree with those on the reference apparatus. By using the ion beam thus adjusted for performing the real irradiation step, the ion implantation process can be carried out in the same conditions as when the reference apparatus is used. It should be noted that, since the implant angle distribution of the beam is included in the calibration, a desired spread of the carrier concentration distribution formed in the vicinity of the gate structure of the target wafer in the depth direction and in the gate length direction results. This enhances the implantation precision of the ion implantation process.

Figure 19:
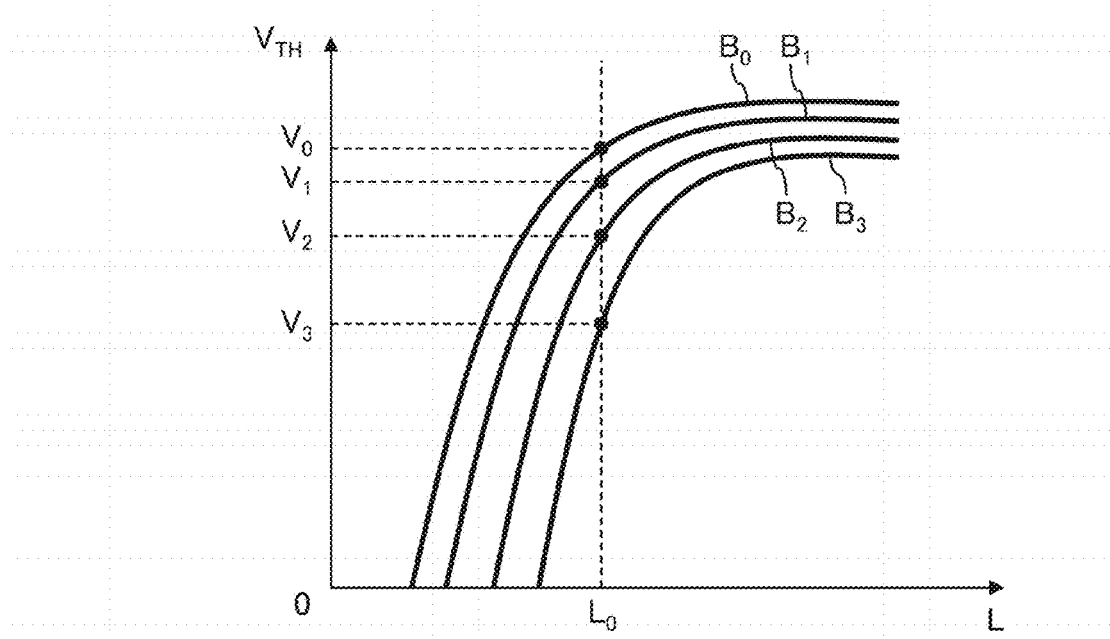
FIG. 19 is a graph showing a relationship between a threshold voltage of the transistor manufactured by ion implantation and the spread of the implant angle distribution of the ion beam used in implantation.

FIG. 19 is a graph showing a relationship between threshold voltages $V_{TH}$ of the transistor manufactured by ion implantation and the implant angle distributions of the ion beam used in implantation. The horizontal axis of the graph represents the gate length L of the transistor, and the vertical axis represents the threshold voltage $V_{TH}$ of the transistor. The degree of spread of the implant angle distribution of ion beams $B_0$, $B_1$, $B_2$, and $B_3$ is such that $B_0 < B_1 < B_2 < B_3$. For example, the ion beam $B_0$ is a parallel beam with a substantially 0 implant angle distribution. The ion beam $B_3$ is a divergent beam with a large implant angle distribution. The characteristics other than the implant angle distribution are common to the ion beams of $B_0$-$B_3$.

As illustrated, the threshold voltage of the transistor manufactured varies by merely varying the implant angle distribution of the ion beam used in the implantation process. For example, the threshold voltages $V_0$, $V_1$, $V_2$, and $V_3$ of the transistor manufactured vary depending on the implant angle distribution when fixing the gate length of the transistor to $L_0$. This is considered to be due to the fact that the spread of the carrier concentration distribution formed below the gate structure varies depending on the implant angle distribution so that the substantial channel length below the gate structure varies accordingly. According to the embodiment, the implant angle of the ion beam used in ion implantation can be adjusted to have a desired distribution so that the implantation process can be controlled and the transistor manufactured has a threshold voltage of a desired value. Therefore, according to the embodiment, the implantation condition can be adjusted or controlled properly so that the semiconductor circuit ultimately manufactured has desired operating characteristics.

In further accordance with the embodiment, the beam characteristics of different implantation apparatuses are evaluated by using the sheet resistance of the evaluation wafer $W_T$. Therefore, evaluation can be made based on a common indicator. When comparing difference apparatuses for beam implant angle distribution, measurement of beams with the same characteristics may result in different measurement results due to the measurement method employed in the implantation apparatuses, the position of installation of the measurement instruments, etc. In this case, the beam implant angle distributions may not agree strictly even if the beams are adjusted so that the values of measurement results agree. Meanwhile, the embodiment makes it possible to make a comparison between different implantation apparatuses according to a common evaluation reference, by using the evaluation wafer with the same characteristics. Accordingly, the precision of calibration between apparatuses can be enhanced according to the embodiment.

Further, by creating a table that maps results of measurement by the angle distribution meter provided in the implantation apparatuses to sheet resistance values of the wafer, measurements of the angle distribution meters can be calibrated based on the implant angle distribution. For example, once the implant angle distribution of the first ion beam is found to be equal to that of the second ion beam by using measurements of sheet resistance, the implant angle distribution of the first ion beam and the second ion beam may be measured by using the Faraday cup or the like provided in the implantation apparatuses. By confirming pairs of measurement results for different implant angle distributions, the measurement characteristics of the angle distribution meters provided in the respective implantation apparatuses are mapped to each other. This process can clarify the correlation wherein, for example, the first implantation apparatus indicates the first angle distribution value and the second implantation apparatus indicates the second angle distribution value different from the first angle distribution value, given that the ion beams are known to have the same implant angle distribution based on the measurement results of sheet resistance. By creating such a correlation table in advance according to the method of the embodiment, it can be ensured that the implant angle distributions agree with a high precision by utilizing the angle distribution measurement function of the implantation apparatuses, without measuring the sheet resistance of the evaluation wafer subsequent to the creation.

The embodiments of the present invention are not limited to those described above and appropriate combinations or replacements of the features of the embodiments are also encompassed by the present invention. The embodiments may be modified by way of combinations, rearranging of the processing sequence, design changes, etc., based on the knowledge of a skilled person, and such modifications are also within the scope of the present invention.

In the embodiment described above, the ion implantation apparatus 10 is assumed to be provided with the sheet resistance meter 64 and the annealing device 66. In one variation, the ion implantation apparatus 10 may not be provided with a sheet resistance meter and an annealing device. The annealing and sheet resistance measurement of the evaluation wafer may be carried out by using a device provided outside the ion implantation apparatus 10.

In the embodiment described above, sheet resistance values of the wafer irradiated with the beam are measured by the four-point probe method. In one variation, different types of resistance values may be measured by different methods. For example, spreading resistance measurement may be used to determine the carrier concentration distribution in the depth direction of the wafer or anode oxidation method may be used to measure the resistance of the wafer.

The embodiment described above relates to a case where the carrier concentration distribution in the vicinity of the gate structure formed on the target wafer surface is controlled. In one variation, the beam implant angle distribution may be controlled so that a desired carrier concentration distribution is formed in the vicinity of an arbitrary three-dimensional structure or a three-dimensional shielding object formed on the target wafer surface. The structure formed on the target wafer surface may be a fin structure used in, for example, a FinFET, a trench structure used in, for example, a vertical transistor, an isolation oxide film for isolating transistors from each other, a photoresist pattern, etc. Where a structure like these is provided, the beam implant angle distribution can be adjusted so that the carrier concentration distributions in the depth direction perpendicular to the target wafer surface and in the horizontal direction parallel to the target wafer surface have desired spreads.

The embodiment described above relates to a case where the quadrupole lenses in three stages are used as lens s for adjusting the implant angle distribution of the beam. In one variation, two or more arbitrary lens s capable of controlling the implant angle distribution in the x direction and in the y direction independently may be used. For example, the first einzel lens device for controlling convergence or divergence in the horizontal direction (x direction) and the second einzel lens device for controlling convergence or divergence in the vertical direction (y direction) may be used in combination. The first einzel lens device may include a pair of electrodes opposite to each other in the x direction and the implant angle distribution in the x direction may be controlled according to the voltage Vx applied to the pair of electrodes. The second einzel lens device may include a pair of electrodes opposite to each other in the y direction and the implant angle distribution in the y direction may be controlled according to the voltage Vy applied to the pair of electrodes.

It should be understood that the invention is not limited to the above-described embodiment, but may be modified into various forms on the basis of the spirit of the invention. Additionally, the modifications are included in the scope of the invention.

What is claimed is:

1. An ion implantation method for scanning an ion beam reciprocally in an x direction and moving a wafer reciprocally in a y direction to implant ions into the wafer, the method comprising:
   irradiating a first wafer arranged to meet a predetermined plane channeling condition with the ion beam and measuring resistance of the first wafer irradiated with the ion beam;
   irradiating a second wafer arranged to meet a predetermined axial channeling condition with the ion beam and measuring resistance of the second wafer irradiated with the ion beam; and adjusting an implant angle distribution of the ion beam relative to the wafers in the x direction and in the y direction by using results of measuring the resistance of the first and second wafers,
   wherein the implant angle distribution is adjusted independently in the x direction and in the y direction by using two or more lens devices for converging or diverging the ion beam by applying at least one of an electric field and a magnetic field.

2. The ion implantation method according to claim 1, further comprising: irradiating a target wafer with the ion beam with the adjusted implant angle distribution, and the implant angle distribution is adjusted to form a desired carrier concentration distribution in the target wafer.

3. The ion implantation method according to claim 2, wherein
   the target wafer includes a structure formed on a target wafer surface, and
   the implant angle distribution is adjusted to result in a desired spread of carrier concentration distribution in the vicinity of the structure.

4. The ion implantation method according to claim 3, wherein
   the structure is a gate structure, and
   the implant angle distribution is adjusted to result in a desired spread of carrier concentration distribution in the vicinity of the gate structure in a depth direction and in a gate length direction.

5. The ion implantation method according to claim 1, wherein
   the first wafer is arranged so as to include a channeling plane parallel to a reference plane defined by a direction aligned with a reference trajectory of the ion beam incident into the first wafer and by the y direction and not to include a channeling plane perpendicular to the reference plane.

6. The ion implantation method according to claim 5, wherein
   the first wafer is a crystalline substrate which has a principal surface of a (100) plane and is arranged so that a twist angle between a <110> orientation of the first wafer and the y direction is substantially 0° or 45° and a tilt angle between a normal to the principal surface of the first wafer and the direction aligned with the reference trajectory is within a range of 15°-60°.

7. The ion implantation method according to claim 1, wherein
the second wafer is arranged so as to include a channeling axis in a direction aligned with a reference trajectory of the ion beam incident on the second wafer and not to include a channeling plane parallel or perpendicular to a reference plane defined by a direction aligned with the reference trajectory of the ion beam incident on the second wafer and the y direction.

8. The ion implantation method according to claim 7, wherein
the second wafer is a crystalline substrate which has a principal surface of a (100) plane and is arranged so that a twist angle between a <110> orientation of the second wafer and the y direction is within a range of 15°-30° and a tilt angle between a normal to the principal surface of the second wafer and the direction aligned with the reference trajectory is substantially 0°.

9. The ion implantation method according to claim 1, wherein
the first and second wafers are crystalline substrates which have an off angle of the principal surface to be 0.1° or smaller.

10. The ion implantation method according to claim 1, further comprising:
at least one of i) annealing the first wafer irradiated with the ion beam before measuring the resistance of the first wafer and ii) annealing the second wafer irradiated with the ion beam before measuring the resistance of the second wafer.

11. The ion implantation method according to claim 10, wherein
the wafer is annealed at an annealing temperature of 900° C.-1000° C.

12. The ion implantation method according to claim 1, further comprising:
irradiating a third wafer arranged to meet a predetermined off-channeling condition with the ion beam and measuring resistance of the third wafer irradiated with the ion beam; and
adjusting an ion implantation dose amount of the ion beam by using a result of measuring the resistance of the third wafer.

13. The ion implantation method according to claim 12, wherein
the third wafer is a crystalline substrate which has a principal surface of a (100) plane and is arranged so that a twist angle between a <110> orientation of the third wafer and the y direction is within a range of 150°-30° and a tilt angle between a normal to the principal surface of the third wafer and a direction aligned with a reference trajectory of the ion beam incident on the principal surface of the third wafer is within a range of 7°-15°.

14. The ion implantation method according to claim 12, wherein
the third wafer is a substrate which has a principal surface, a vicinity of which is turned into an amorphous state.

15. The ion implantation method according to claim 1, wherein
the resistance of the wafer is measured by measuring sheet resistance of the wafer by using a four-point probe method.

16. The ion implantation method according to claim 1, wherein
the first and second wafers are irradiated with a first ion beam generated by a first ion implantation apparatus and the implant angle distribution of the first ion beam is adjusted,
the ion implantation method further comprising:
irradiating a fourth wafer arranged to meet the predetermined plane channeling condition with a second ion beam generated by a second ion implantation apparatus different from the first ion implantation apparatus and measuring resistance of the fourth wafer irradiated with the second ion beam; and
irradiating a fifth wafer arranged to meet the predetermined axial channeling condition with the second ion beam and measuring resistance of the fifth wafer irradiated with the second ion beam, wherein
the implant angle distribution is adjusted by using a result of comparing the first and the fourth wafers for resistance and a result of comparing the second and fifth wafers for resistance.

* * * * *